(12) United States Patent
Han et al.

(10) Patent No.: US 11,984,349 B2
(45) Date of Patent: May 14, 2024

(54) SEMICONDUCTOR DEVICE

(71) Applicant: SAMSUNG ELECTRONICS CO., LTD., Suwon-si (KR)

(72) Inventors: Jung-Hoon Han, Hwaseong-si (KR); Seokhwan Kim, Busan (KR); Joodong Kim, Hwaseong-si (KR); Junyong Noh, Yongin-si (KR); Jaewon Seo, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 303 days.

(21) Appl. No.: 17/482,796

(22) Filed: Sep. 23, 2021

(65) Prior Publication Data
US 2022/0005730 A1 Jan. 6, 2022

Related U.S. Application Data

(62) Division of application No. 16/420,328, filed on May 23, 2019, now Pat. No. 11,139,199.

(30) Foreign Application Priority Data

Aug. 17, 2018 (KR) ........................ 10-2018-0096274

(51) Int. Cl.
*H01L 23/00* (2006.01)
*H01L 21/768* (2006.01)
(52) U.S. Cl.
CPC .. *H01L 21/76802* (2013.01); *H01L 21/76829* (2013.01); *H01L 23/562* (2013.01)

(58) Field of Classification Search
CPC ................ H01L 22/34; H01L 23/544; H01L 21/67242–67294
See application file for complete search history.

(56) References Cited

U.S. PATENT DOCUMENTS

| | | | |
|---|---|---|---|
| 6,211,070 B1 | 4/2001 | Iwasaki et al. | |
| 7,994,613 B2 | 8/2011 | Jung | |
| 8,173,539 B1 | 5/2012 | Huang et al. | |
| 8,593,000 B2 | 11/2013 | Ushida et al. | |
| 9,059,062 B2 | 6/2015 | Yorikado et al. | |
| 9,607,954 B2 | 3/2017 | Yajima | |
| 9,818,701 B2 | 11/2017 | Yoshizawa et al. | |
| 2007/0063317 A1 | 3/2007 | Kim et al. | |
| 2010/0072578 A1* | 3/2010 | Kunishima | H01L 23/585 257/E23.179 |

(Continued)

FOREIGN PATENT DOCUMENTS

| | | |
|---|---|---|
| DE | 102014102087 A1 | 8/2014 |
| ID | 2019/00881 | 2/2019 |

(Continued)

*Primary Examiner* — Moazzam Hossain
(74) *Attorney, Agent, or Firm* — Fish & Richardson P.C.

(57) ABSTRACT

A semiconductor device including a semiconductor substrate including a chip region and an edge region around the chip region; a lower dielectric layer and an upper dielectric layer on the semiconductor substrate; a redistribution chip pad that penetrates the upper dielectric layer on the chip region and is connected a chip pad; a process monitoring structure on the edge region; and dummy elements in the edge region and having an upper surface lower than an upper surface of the upper dielectric layer.

18 Claims, 34 Drawing Sheets

(56) References Cited

U.S. PATENT DOCUMENTS

| | | | |
|---|---|---|---|
| 2010/0109005 A1* | 5/2010 | Grillberger | H01L 22/34 257/E21.531 |
| 2010/0148314 A1 | 6/2010 | Han | |
| 2014/0151698 A1 | 6/2014 | Chen et al. | |
| 2014/0232001 A1* | 8/2014 | Gratz | H01L 23/585 438/622 |
| 2014/0239455 A1 | 8/2014 | Ishii | |
| 2015/0076665 A1 | 3/2015 | Shiu et al. | |
| 2015/0179606 A1 | 6/2015 | Gratz et al. | |
| 2018/0315723 A1* | 11/2018 | Singh | H01L 21/78 |
| 2019/0139841 A1* | 5/2019 | Stamper | H01L 23/544 |

FOREIGN PATENT DOCUMENTS

| | | |
|---|---|---|
| JP | H 05152433 A | 6/1993 |
| JP | 2004134640 A | 4/2004 |
| JP | 2011134963 A | 7/2011 |
| JP | 2012089668 | 5/2012 |
| JP | 2013105919 A | 5/2013 |
| JP | 2014165403 A | 9/2014 |
| JP | 2017034185 A | 2/2017 |
| KR | 10-2008-0070215 A | 7/2008 |
| KR | 10-2009-0043112 A | 5/2009 |

\* cited by examiner

SEMICONDUCTOR DEVICE

CROSS-REFERENCE TO RELATED APPLICATIONS

This is a divisional application based on pending application Ser. No. 16/420,328, filed May 23, 2019, the entire contents of which is hereby incorporated by reference.

Korean Patent Application No. 10-2018-0096274 filed on Aug. 17, 2018 in the Korean Intellectual Property Office, and entitled: "Semiconductor Device," is incorporated by reference herein in its entirety.

BACKGROUND

1. Field

Embodiments relate to a semiconductor device.

2. Description of the Related Art

A semiconductor package may include a semiconductor chip capable of storing a large amount of data and processing the data in a short time. Such a semiconductor chip may include a circuit for storing and/or processing data and chip pads for inputting data to the circuit from the outside or outputting data from the circuit to the outside.

SUMMARY

The embodiments may be realized by providing a semiconductor device including a semiconductor substrate including a chip region and an edge region around the chip region; a lower dielectric layer and an upper dielectric layer on the semiconductor substrate; a redistribution chip pad that penetrates the upper dielectric layer on the chip region and is connected a chip pad; a process monitoring structure on the edge region; and dummy elements in the edge region and having an upper surface lower than an upper surface of the upper dielectric layer.

The embodiments may be realized by providing a semiconductor device including a semiconductor substrate including a chip region and an edge region around the chip region; a lower dielectric layer and an upper dielectric layer on the semiconductor substrate; a redistribution chip pad that penetrates the upper dielectric layer on the chip region and is connected to a chip pad; a process monitoring pattern on the edge region; and a plurality of dummy redistribution patterns that penetrate the upper dielectric layer on the edge region, wherein, when viewed in plan, the dummy redistribution patterns are around the process monitoring pattern.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
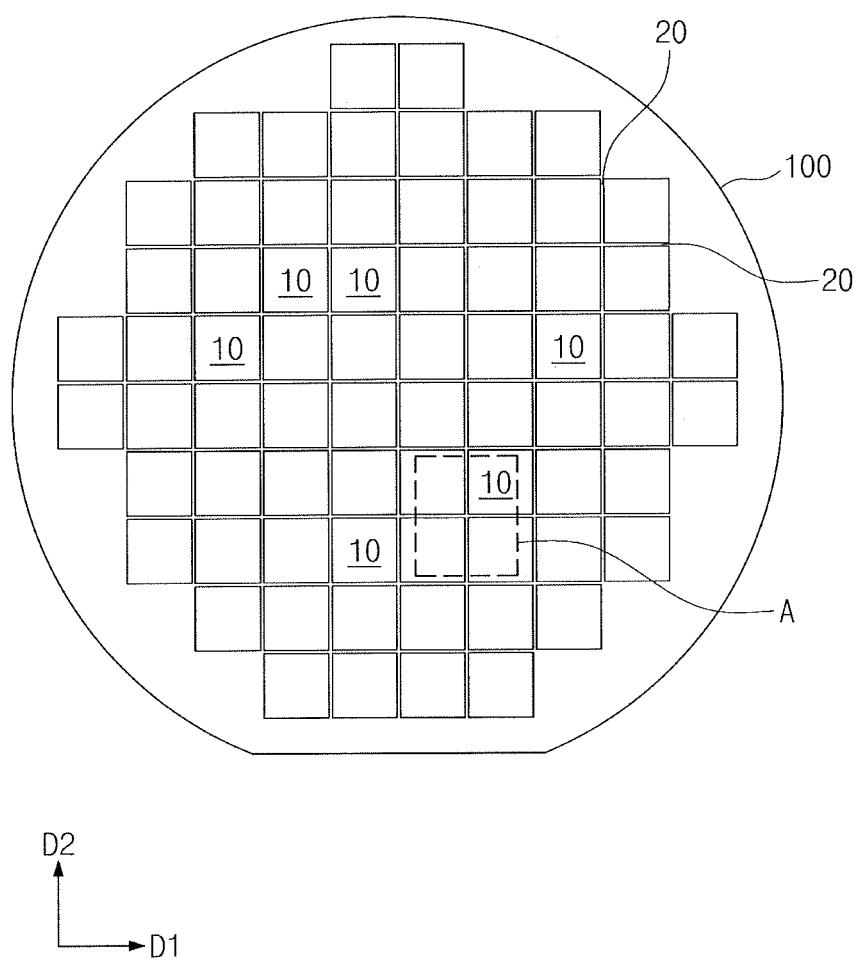
FIG. 1 illustrates a plan view of a substrate with integrated semiconductor devices according to some example embodiments.
Figure 2:
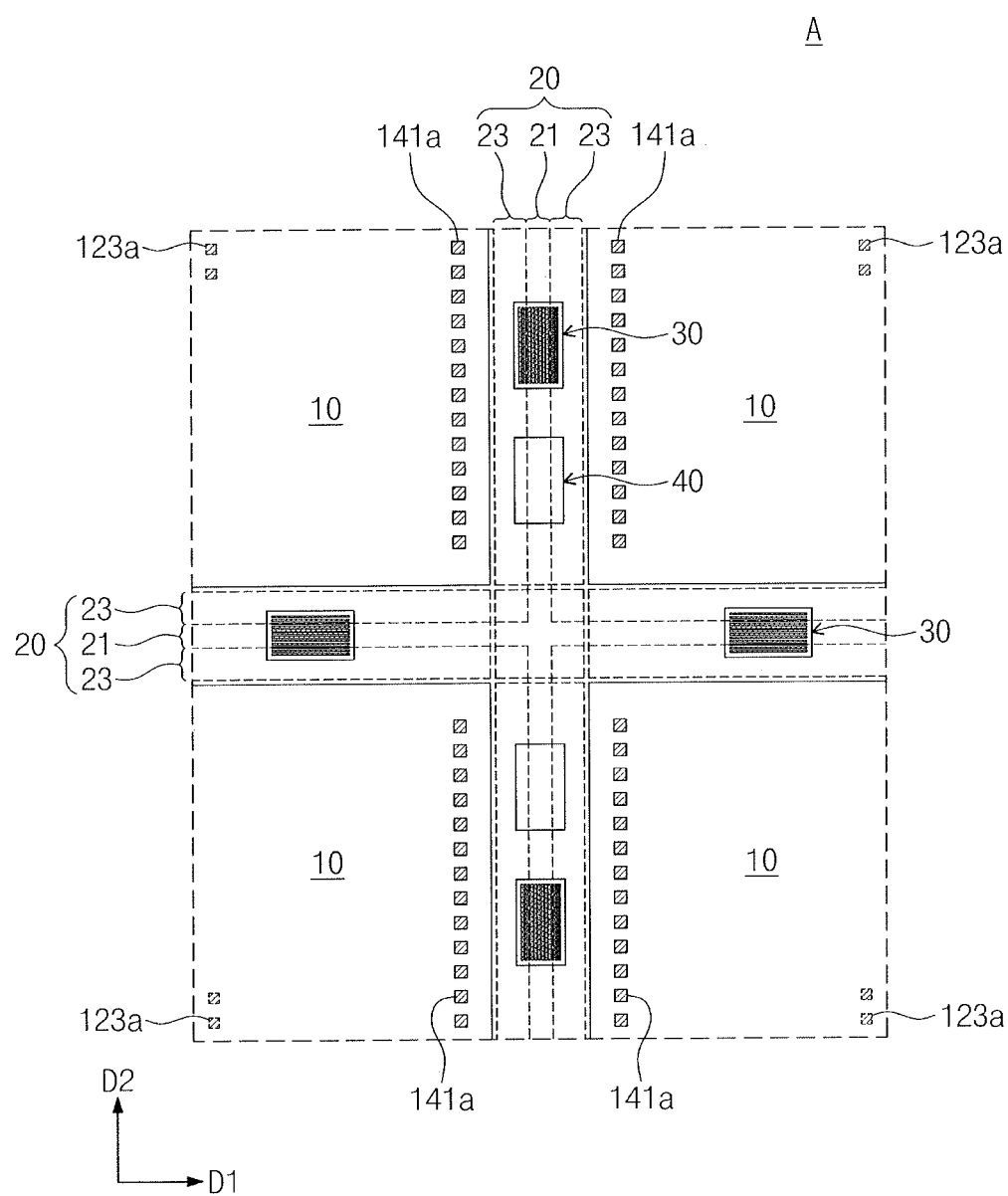
FIG. 2 illustrates an enlarged view of section A of FIG. 1.

FIG. 1 illustrates a plan view of a substrate with integrated semiconductor devices according to some example embodiments. FIG. 2 illustrates an enlarged view showing section A of FIG. 1.

Referring to FIGS. 1 and 2, a semiconductor substrate 100 may include chip regions 10 where semiconductor integrated circuits are formed and a scribe line region 20 between the chip regions 10.

The semiconductor substrate 100 may include one of a semiconductor material (e.g., silicon wafer), a dielectric material (e.g., glass), and a semiconductor or conductor covered with a dielectric material. For example, the semiconductor substrate 100 may be a silicon wafer having a first conductive type.

The chip regions 10 may be two-dimensionally arranged along a first direction D1 and a second direction D2 intersecting the first direction D1. Each of the chip regions 10 may be surrounded by the scribe line region 20.

The scribe line region 20 may include a plurality of first scribe line regions that extend in the first direction D1 and also include a plurality of second scribe line regions that intersect the first scribe line region and extend in the second direction D2. The scribe line region 20 may include a cutting region 21 that will be cut by a sawing or cutting machine and edge regions 23 between the cutting region 21 and the chip regions 10. The edge regions 23 may surround corresponding chip regions 10.

The chip regions 10 of the semiconductor substrate 100 may include semiconductor memory devices such as DRAM (dynamic random access memory), SRAM (static random access memory), NAND Flash memory, or RRAM (resistive random access memory). In an implementation, the chip regions 10 of the semiconductor substrate 100 may include a MEMS (micro electro mechanical system) device, an optoelectronic device, or a processor such as CPU or DSP. In an implementation, the chip regions 10 of the semiconductor substrate 100 may include standard cells including semiconductor devices such as logical sum gate or logical product gate. The chip regions 10 of the semiconductor substrate 100 may also include redistribution chip pads 141a and chip pads 123a that communicate data or signals with semiconductor integrated circuits. The chip pads 123a may be on an edge or center of each chip region 10, and the redistribution chip pads 141a may be at a location different from that of the chip pads 123a.

The scribe line region 20 of the semiconductor substrate 100 may include process monitoring structures 30 and test structures 40. The process monitoring structures 30 may be patterns for monitoring semiconductor device fabrication processes, such as variously shaped alignment patterns that serve as alignment criteria when diverse semiconductor device fabrication processes are performed, overlay patterns for ascertaining an overlay between upper and lower patterns, or measurement patterns for measuring thicknesses and/or line widths of patterns. The test structures 40 may include test device groups (TEG) having substantially the same structure as that of semiconductor integrated circuits so as to evaluate electrical characteristics of semiconductor integrated circuits formed on the chip regions 10. The test device groups may include, e.g., an NMOSFET, a PMOSFET, or a resistor.

Figure 3:
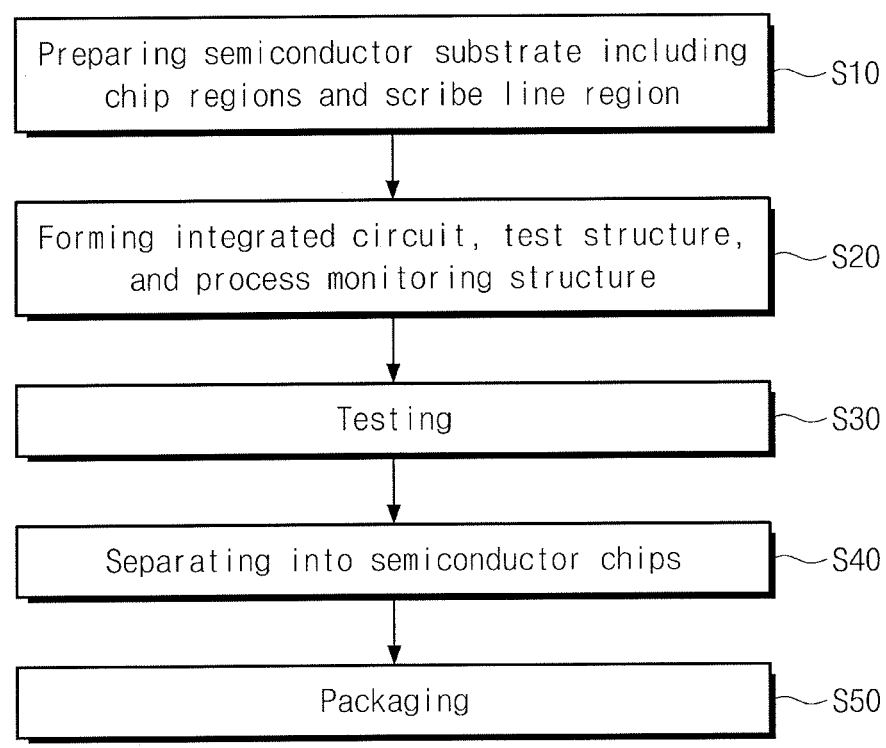
FIG. 3 illustrates a flow chart of a method of fabricating a semiconductor device according to some example embodiments.

FIG. 3 illustrates a flow chart of a method of fabricating a semiconductor device according to some example embodiments.

Referring to FIG. 3, as discussed above with reference to FIGS. 1 and 2, a semiconductor substrate may be prepared to include a plurality of chip regions and a plurality of scribe line regions (S10).

The semiconductor substrate may variously undergo semiconductor device fabrication processes to form semiconductor integrated circuits, process monitoring structures, and test structures (S20). In an implementation, the process monitoring structures may provide criteria for semiconductor device fabrication processes, and the formation of the process monitoring structures may be followed by the formation of the semiconductor integrated circuits and the test structures. For example, the process monitoring structures may be formed on a portion of the scribe line region, and thereafter the test structures may be formed on a remaining portion of the scribe line region.

After the semiconductor integrated circuits and the test structures are formed, a test process may be performed on the test structures (S30). When the test process is performed, electrical signals may be provided through test pads to the test structures, and the test structures may be used to evaluate electrical characteristics of the semiconductor integrated circuits.

After the test process is performed, a sawing or dicing process may be performed along a cutting region of the scribe line region. The semiconductor substrate may thus be separated into the chip regions (e.g., semiconductor chips) on which the semiconductor integrated circuits are formed (S40).

A packaging process may be performed on the individually separated semiconductor chips (S50).

Figure 4A:
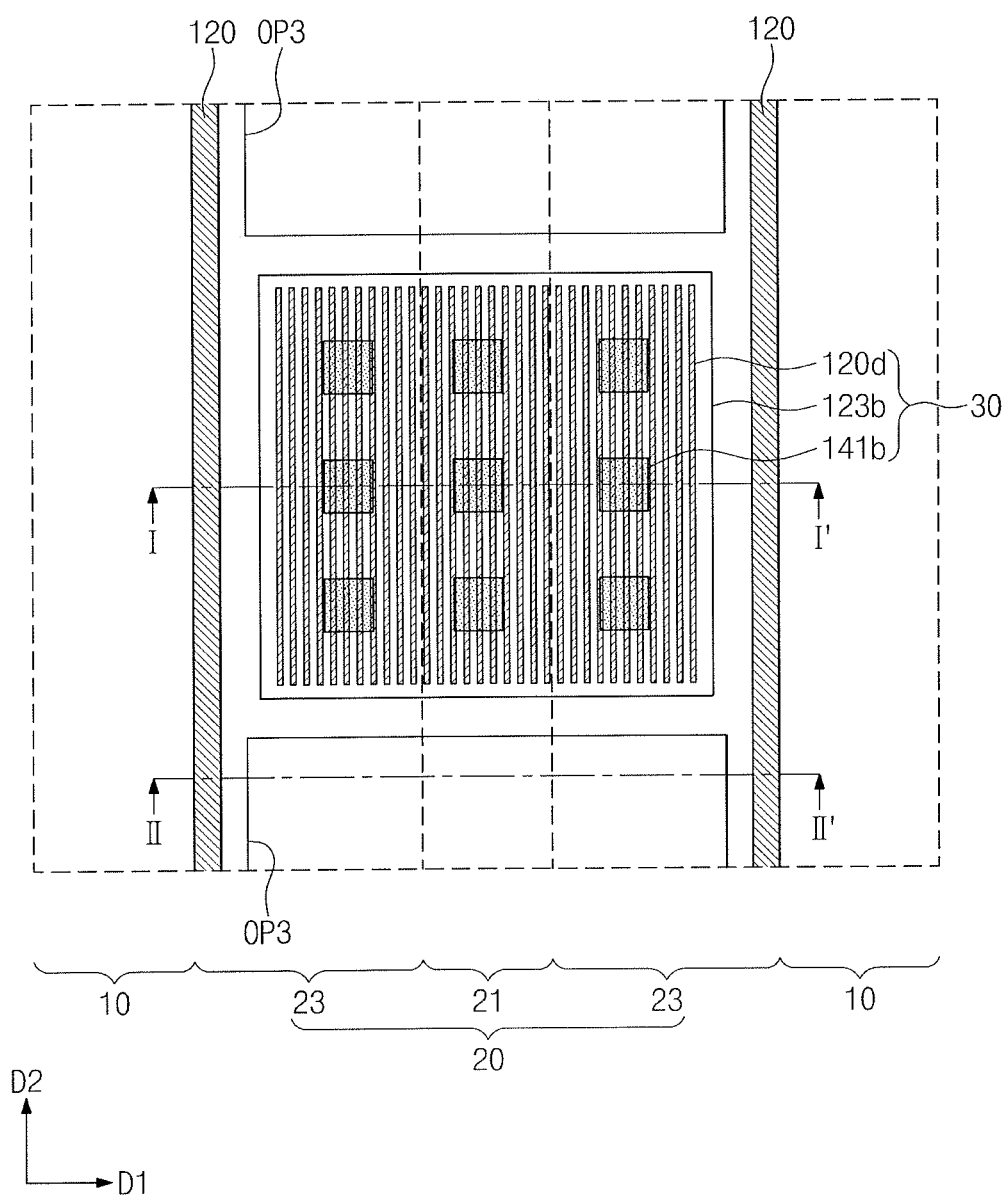
FIGS. 4A and 4B illustrate partially enlarged plan views of a semiconductor device, respectively before and after separation into semiconductor chips, according to some example embodiments.
Figure 4B:
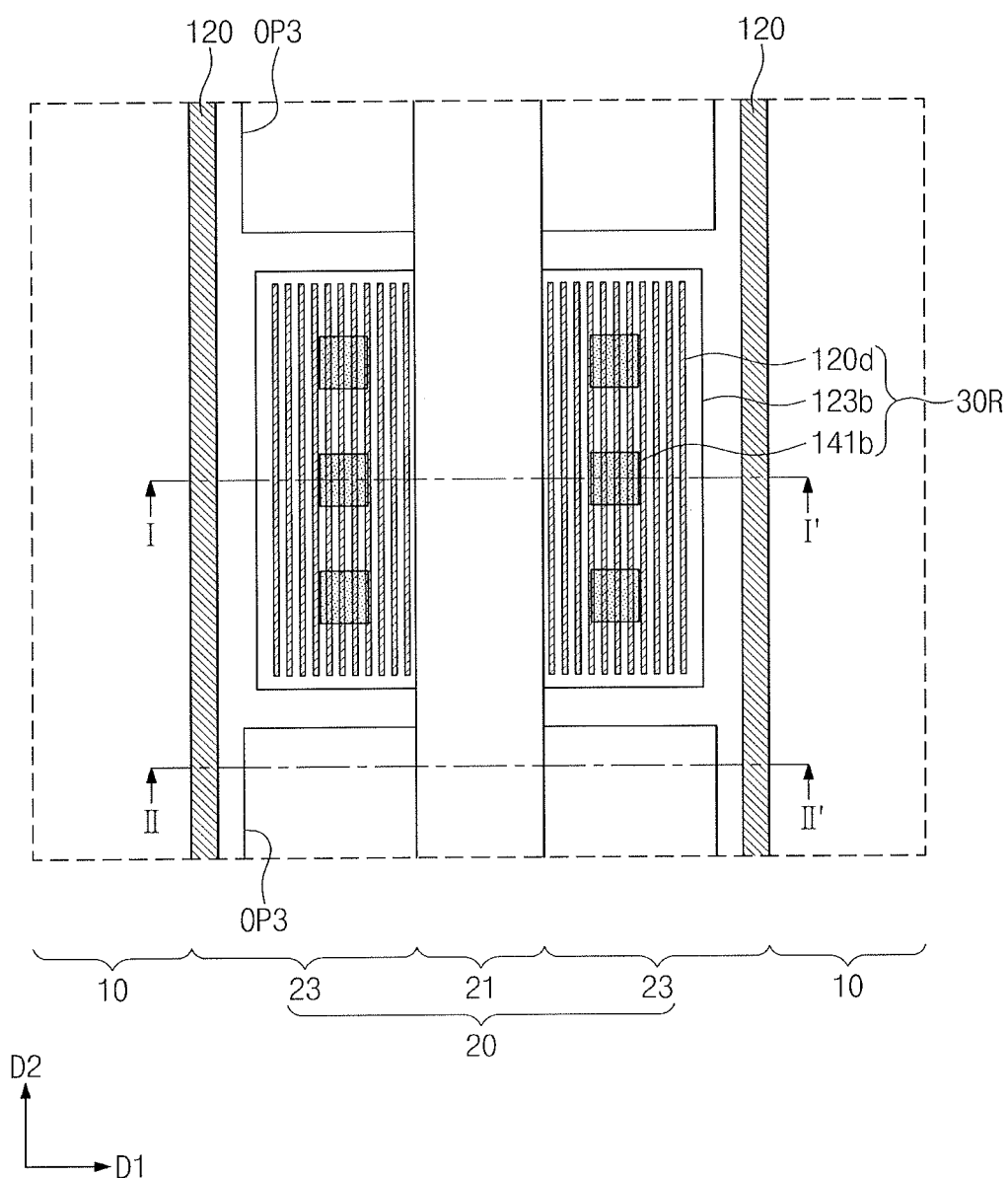

FIGS. 4A and 4B illustrate enlarged plan views of a semiconductor device, respectively before and after separation into semiconductor chips, according to some example embodiments. FIGS. 5A to 5H illustrate cross-sectional views taken along lines I-I' and II-II' of FIGS. 4A and 4B, of stages in a method of fabricating a semiconductor device according to some example embodiments.

Figure 5A:
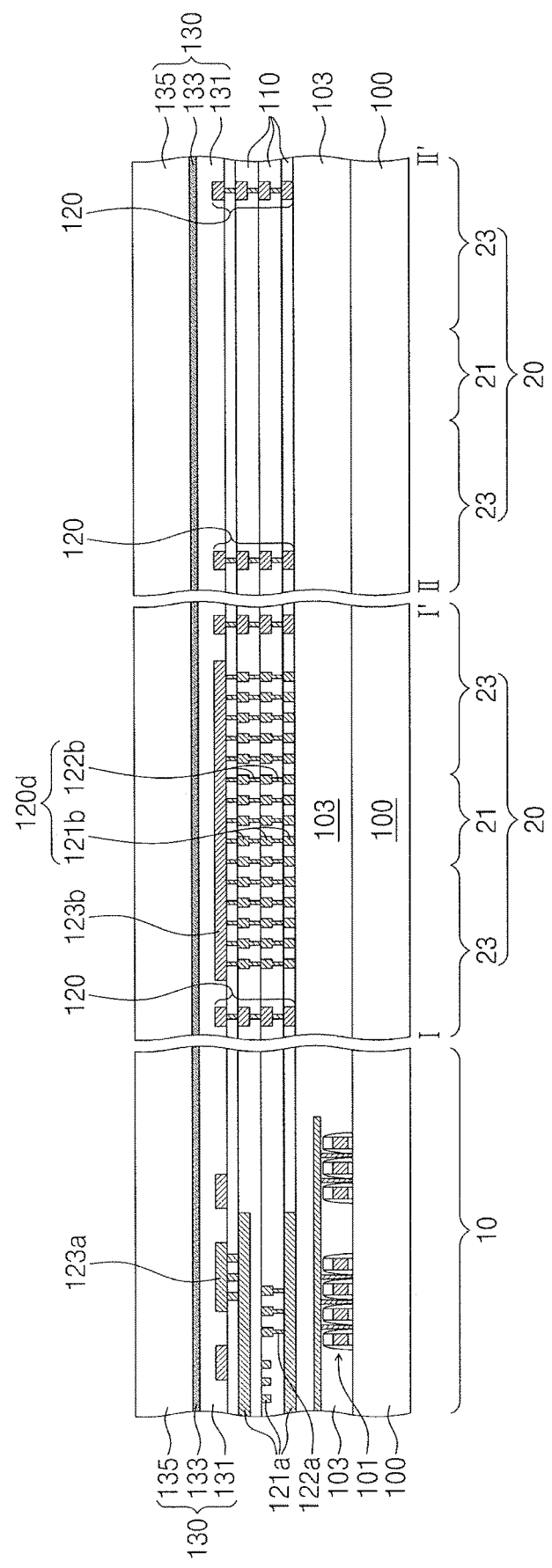
FIGS. 5A to 5H illustrate cross-sectional views taken along lines I-I' and II-II' of FIGS. 4A and 4B, of stages in a method of fabricating a semiconductor device according to some example embodiments.

Referring to FIGS. 4A and 5A, a semiconductor substrate 100 may include a plurality of chip regions 10 and a scribe line region 20, which scribe line region 20 may include a cutting region 21 at a central portion thereof and edge regions 23 between the cutting region 21 and the chip regions 10. The scribe line region 20 may extend in a first direction D1 and/or a second direction D2. Identically or similarly to that shown in FIG. 2, the scribe line region 20 may include a first scribe line region extending in the first direction D1 and a second scribe line region extending in the second direction D2.

A semiconductor integrated circuit 101 may be formed on the semiconductor substrate 100 of the chip region 10. The semiconductor integrated circuit 101 may include a memory cell array that includes switching elements and data storage elements, and also include logic devices that include a MOSFET, a capacitor, and a resistor. The semiconductor integrated circuit 101 may be covered with an interlayer dielectric layer 103, which interlayer dielectric layer 103 may completely cover the semiconductor substrate 100. The interlayer dielectric layer 103 may include a silicon oxide layer, a silicon nitride layer, or a silicon oxynitride layer.

When the semiconductor integrated circuit 101 is formed, a plurality of test device groups (see 40 of FIG. 2) may be simultaneously formed on a portion of the scribe line region 20. The test device groups (see 40 of FIG. 2) may include various test circuits that are used to test the semiconductor integrated circuits 101. The test device groups may include substantially the same structure as that of the semiconductor integrated circuits 101.

A lower dielectric layer 110 may be formed to completely cover the semiconductor substrate 100 and may include a plurality of dielectric layers. In an implementation, the lower dielectric layer 110 may be formed of a low-k dielectric material whose dielectric constant is less than that of a silicon oxide layer. The lower dielectric layer 110 may have a dielectric constant ranging from about 1.0 to about 3.0, and may include one or more of an inorganic material, an organic material, and an organic-inorganic hybrid material. In an implementation, the lower dielectric layer 110 may be porous or non-porous. The lower dielectric layer 110 may be formed of, e.g., an impurity-doped silicon oxide material or a low-k organic polymer. The impurity-doped silicon oxide material may include, e.g., fluorine-doped oxide (or, an FSG layer), carbon-doped oxide, silicon oxide, HSQ (hydrogen silsesquioxane, SiO:H), MSQ (methyl silsesquioxane, SiO:CH3), or a-SiOC (SiOC:H). The low-k organic polymer may include, e.g., polyallylether resin, cyclic fluoride resin, siloxane copolymer, polyallylether fluoride resin, polypentafluorostyrene, polytetrafluorostyrene resin, polyimide fluoride resin, polynaphthalene fluoride, or polycide resin. The lower dielectric layer 110 may further include one or more barrier layers between the vertically stacked dielectric layers, and the barrier layer may include a dielectric material such as SiN, SiON, SiC, SiCN, SiOCH, SiOC, or SiOF.

An internal connection structure 121a and 122a may be formed in the lower dielectric layer 110 of the chip region 10. The internal connection structure 121a and 122a may be electrically connected to the semiconductor integrated circuit 101. The internal connection structure 121a and 122a may include metal lines 121a and metal vias 122a, which metal vias 122a may penetrate the lower dielectric layer 110 and connect the metal lines 121a at different levels. The metal lines 121a and the metal vias 122a may include a first metal material, such as W, Al, Ti, Ta, Co, or Cu. For example, the metal lines 121a and the metal vias 122a may include copper (Cu). The metal lines 121a and the metal vias 122a may each include metal nitride, such as TiN, WN, TaN, or TaSiN, as a barrier metal layer.

A chip pad 123a may be on an uppermost dielectric layer of the lower dielectric layer 110, and may be electrically connected through the internal connection structure 121a and 122a to the semiconductor integrated circuit 101. The chip pad 123a may be a data pad that communicates data signals, a command/address pad that communicates command/address signals, a ground or power pad to which a ground or power voltage is applied, or a pad for testing the semiconductor integrated circuit 101. The chip pad 123a may include a second metal material, such as W, Al, Ti, Ta, Co, or Cu, different from the first metal material. For example, the chip pad 123a may include aluminum (Al). The chip pad 123a may include metal nitride, such as TiN, WN, TaN, or TaSiN, as a barrier metal layer.

A dam structure 120 may be formed on the semiconductor substrate 100 of the edge region 23. When viewed in plan, the dam structure 120 may surround each of the chip regions 10. When viewed in plan, the dam structure 120 may have a ring shape or a closed curve shape. The dam structure 120 may be formed simultaneously with the internal connection structure 121a and 122a of the chip region 10, and may include metal vias penetrating the lower dielectric layer 110 and metal lines on the metal vias.

In an implementation, the scribe line region 20 may include at a portion thereof a process monitoring structure that includes dummy metal structures 120d and a dummy metal pattern 123b. For example, the dummy metal structures 120d may be formed in the lower dielectric layer 110 of the scribe line region 20, and the dummy metal pattern 123b may be formed on the lower dielectric layer 110.

The dummy metal structures 120d may include dummy metal lines 121b and dummy metal vias 122b that are alternately stacked. Each of the dummy metal lines 121b may have a linear shape parallel to an extending direction of the scribe line region 20. For example, the dummy metal lines 121b may extend in the first direction D1 on the first scribe line region extending in the first direction D1, and may extend in the second direction D2 on the second scribe line region extending in the second direction D2. The dummy metal vias 122b may connect the dummy metal lines 121b at different levels. The dummy metal structures 120d may be formed simultaneously with the internal connection structure 121a and 122a of the chip region 10, and may include the first metal material, for example, copper (Cu).

The dummy metal pattern 123b may cover the dummy metal structures 120d. For example, when viewed in plan, the dummy metal pattern 123b may overlap a plurality of the dummy metal lines 121b. The dummy metal pattern 123b may be formed simultaneously with the chip pad 123a of the chip region 10, and may include the second metal material, for example, aluminum (Al).

An upper dielectric layer 130 may be formed on the entire surface of the semiconductor substrate 100, and may cover the chip pad 123a and the dummy metal pattern 123b on the uppermost one of the lower dielectric layer 110. In an implementation, the upper dielectric layer 130 may include a dielectric material whose strength is greater than that of the lower dielectric layer 110. The upper dielectric layer 130 may include a dielectric material whose dielectric constant is greater than that of the lower dielectric layer 110. The upper dielectric layer 130 may include a silicon oxide layer, a silicon nitride layer, or a silicon oxynitride layer. The upper dielectric layer 130 may include, for example, silicon nitride (SiN), silicon oxynitride (SiON), silicon carbonitride (SiCN), high density plasma (HDP) oxide, TEOS (tetraethylorthosilicate), PE-TEOS (plasma enhanced tetraethylorthosilicate), $O_3$-TEOS ($O_3$-tetratthylorthosilicate), USG (undoped silicate glass), PSG (phosphosilicate glass), BSG (borosilicate glass), BPSG (borophosphosilicate glass), FSG (fluorosilicate glass), SOG (spin on glass), TOSZ (Tonen Silazene), or a combination thereof.

In an implementation, the upper dielectric layer 130 may include a plurality of dielectric layers. For example, the upper dielectric layer 130 may include a first upper dielectric layer 131, a second upper dielectric layer 133, and a third upper dielectric layer 135 that are sequentially stacked on the lower dielectric layer 110. The second upper dielectric layer 133 may be formed of a dielectric material having an etch selectivity with respect to the first and third upper dielectric layers 131 and 135, and may be thinner than the first and third upper dielectric layers 131 and 135. The first and third upper dielectric layers 131 and 135 may be formed of different dielectric materials from each other, and the third upper dielectric layer 135 may be thicker than the first upper dielectric layer 131. For example, the first upper dielectric layer 131 may be a high density plasma (HDP) oxide layer, the second upper dielectric layer 133 may be a silicon nitride layer, and the third upper dielectric layer 135 may be a tetraethylorthosilicate (TEOS) layer.

Figure 5B:
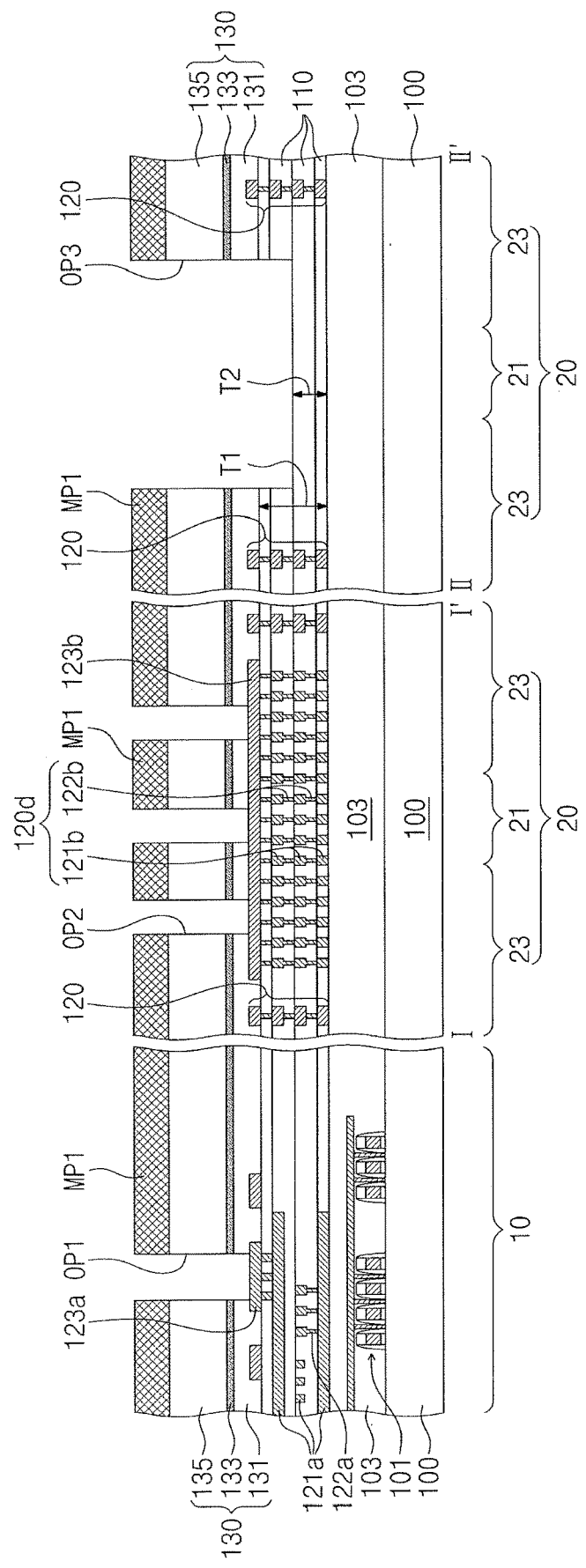

Referring to FIGS. 4A and 5B, the upper dielectric layer 130 may be patterned to form first openings OP1 that expose the chip pads 123a, second openings OP2 that expose portions of the dummy metal pattern 123b, and a third opening OP3 that exposes the lower dielectric layer 110 on a portion of the scribe line region 20.

The formation of the first, second, and third openings OP1, OP2, and OP3 may include forming a first mask pattern MP1 having openings on the upper dielectric layer 130, and using the first mask pattern MP1 as an etching mask to anisotropically etch a portion of the upper dielectric layer 130. After the first, second, and third openings OP1, OP2, and OP3 are formed, the first mask pattern MP1 may be removed.

On each of the chip regions 10, the first openings OP1 may be formed to have substantially the same size and a uniform interval therebetween. The second openings OP2 may be formed to have a size less than that of the dummy metal pattern 123b and to be spaced apart from each other. In an implementation, the second openings OP2 may have a rectangular, circular, or polygonal shape.

The first, second, and third openings OP1, OP2, and OP3 may be formed at the same time, and the second opening OP2 may have an etching depth greater than those of the first and third openings OP1 and OP3. For example, the third opening OP3 may have a bottom surface lower than (e.g., closer to the substrate 100 than) those of the first and second openings OP1 and OP2. The third opening OP3 may have a width different from those of the first and second openings OP1 and OP2.

In an implementation, the formation of the third opening OP3 may reduce thicknesses of the lower and upper dielectric layers 110 and 130 on a portion of the scribe line region 20. For example, on a portion of the scribe line region 20, the lower dielectric layer 110 may include a first segment having a first thickness T1 and a second segment having a second thickness T2 less than the first thickness T1. The first thickness T1 of the first segment may be substantially the same as a thickness of the lower dielectric layer 110 on the chip region 10.

Figure 5C:
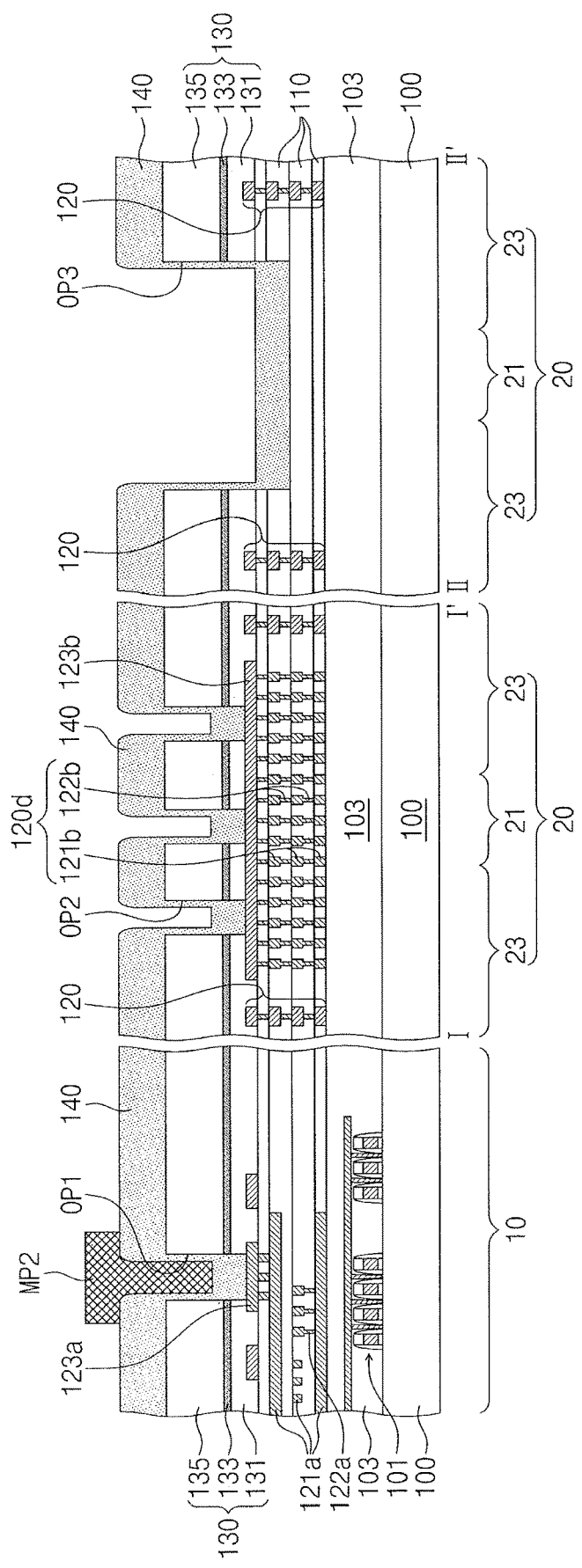

Referring to FIGS. 4A and 5C, a redistribution layer 140 may be formed on the upper dielectric layer 130 having the first, second, and third openings OP1, OP2, and OP3. The formation of the redistribution layer 140 may include forming a metal seed layer to conformally cover the upper dielectric layer 130 having the first, second, and third openings OP1, OP2, and OP3, and then forming a metal layer on the metal seed layer. The metal seed layer and the metal layer may be formed by a thin-layer deposition technique such as electroplating, electroless plating, or sputtering. The redistribution layer 140 may include, e.g., copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), carbon (C), or an alloy thereof. In an implementation, the redistribution layer 140 may include aluminum (Al).

The redistribution layer 140 may partially fill the first, second, and third openings OP1, OP2, and OP3, and may be in contact with the chip pad 123a and the dummy metal pattern 123b that are respectively exposed to the first and second openings OP1 and OP2.

After the redistribution layer 140 is formed, a second mask pattern MP2 may be formed on the redistribution layer 140. The second mask pattern MP2 may fill the first opening OP1 on the chip pad 123a. The second mask pattern MP2 may be used as an etching mask to etch the redistribution layer 140.

Figure 5D:
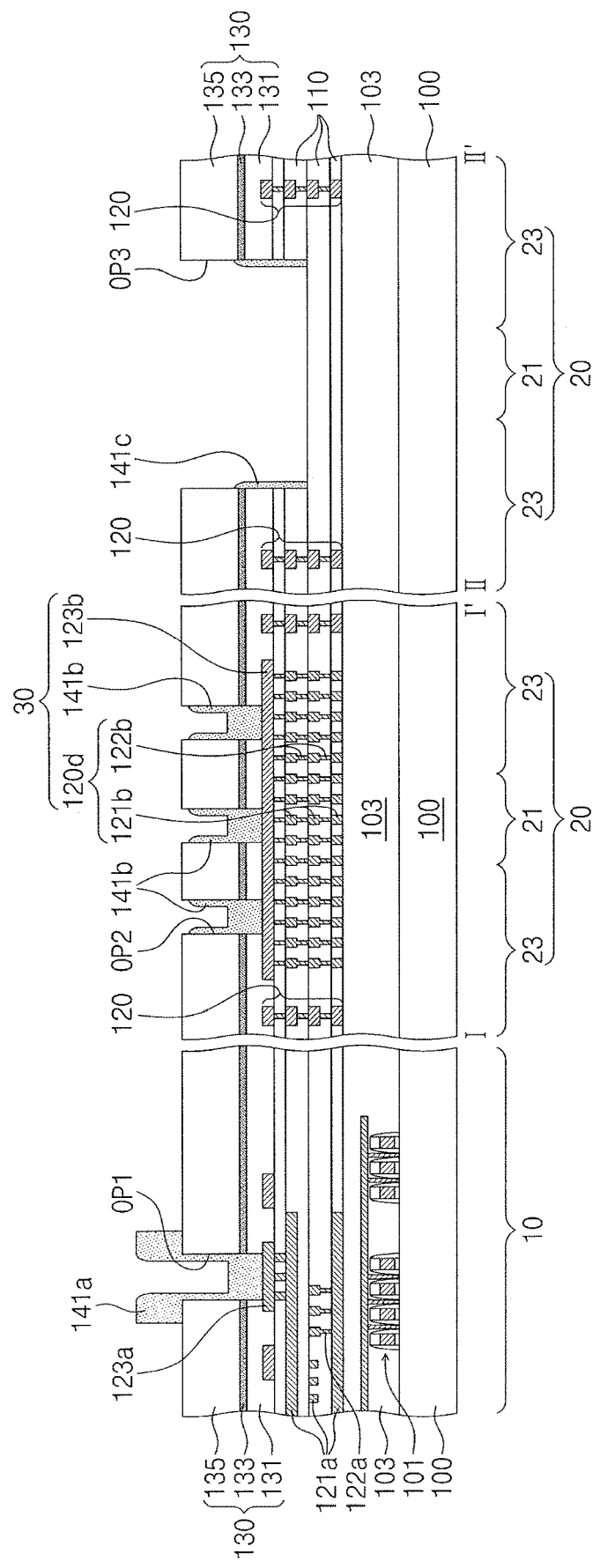

Therefore, as shown in FIGS. 4A and 5D, a redistribution chip pad 141a may be formed in the first opening OP1 of the chip region 10. During the formation of the redistribution chip pad 141a, a top surface of the upper dielectric layer 130 on the scribe line region 20 may be exposed, and redistribution alignment patterns 141b may be formed in the second openings OP2 on the scribe line region 20.

The redistribution alignment patterns 141b may be formed in corresponding second openings OP2, and may each include a bottom segment in contact with the dummy metal pattern 123b and sidewall segments covering inner walls of the second opening OP2. Each of the redistribution alignment patterns 141b may have a top surface at a level lower than that of a top surface of the upper dielectric layer 130.

As the redistribution alignment patterns 141b are formed as discussed above, a process monitoring structure 30 may be formed on a portion of the scribe line region 20. The process monitoring structure 30 may include the dummy metal structures 120d, the dummy metal pattern 123b, and the redistribution alignment patterns 141b. The redistribution alignment patterns 141b may be used as alignment criteria when subsequent semiconductor processes are performed.

During the formation of the redistribution chip pad 141a and the redistribution alignment patterns 141b, the redistribution layer 140 may be removed from a bottom surface of the third opening OP3, and a redistribution spacers 141c may remain on an inner wall of the third opening OP3. For example, the redistribution spacer 141c may include the same metallic material as that of the redistribution chip pad 141a and that of the redistribute alignment patterns 141b. In an implementation, the redistribution layer 140 may be completely removed from inside the third opening OP3, and the inner wall of the third opening OP3 may be exposed.

Figure 5E:
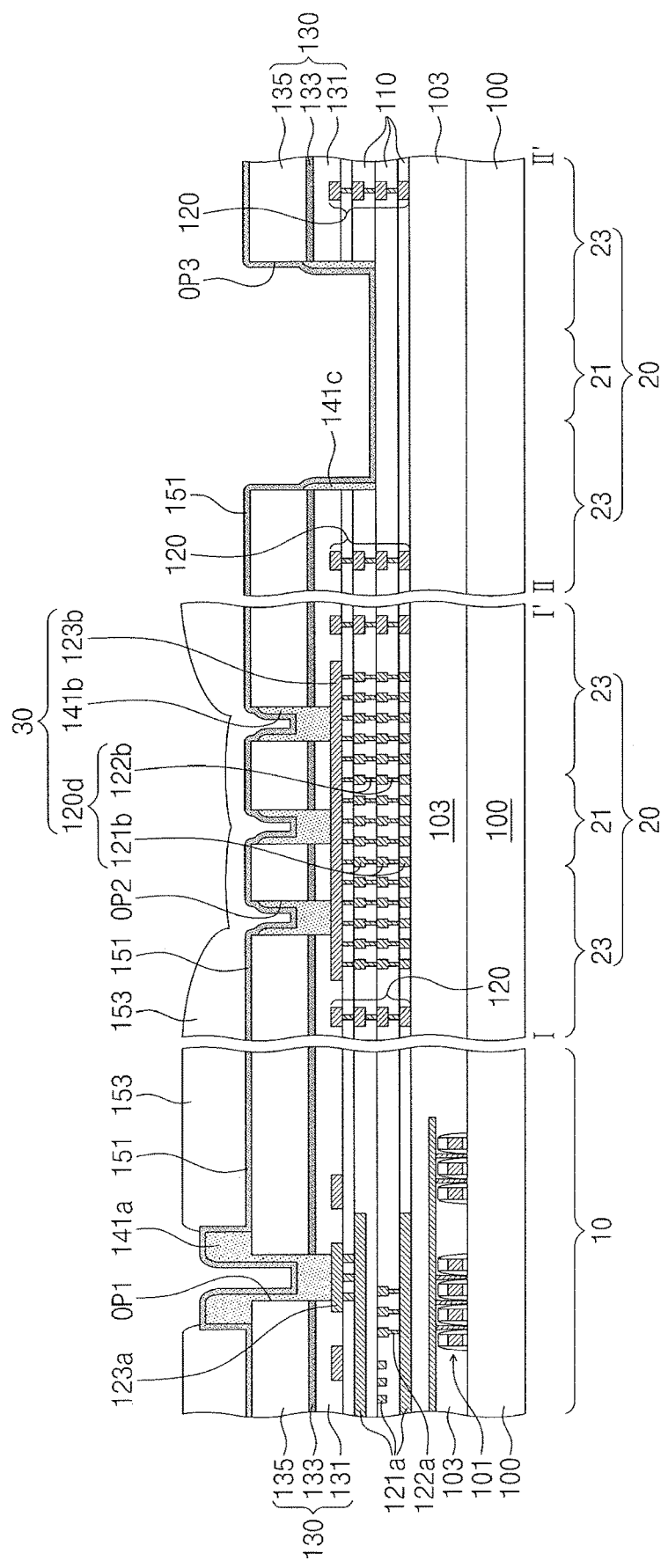

Referring to FIGS. 4A and 5E, a passivation layer 153 may be formed on the upper dielectric layer 130 of the chip region 10, partially exposing the redistribution chip pad 141a. Before the passivation layer 153 is formed, a protection layer 151 may be formed to have a uniform thickness on the entire surface of the semiconductor substrate 100.

The protection layer 151 may include, e.g., a silicon nitride layer or a silicon oxynitride layer. The passivation layer 153 may include, e.g., a polyimide material such as photosensitive polyimide (PSPI). A spin coating process may be employed to deposit the passivation layer 153 on the protection layer 151, and without forming a photoresist layer, exposure and patterning processes may be performed to partially expose the protection layer 151 on the redistribution chip pad 141a and to expose the protection layer 151 of the scribe line region 20.

Figure 5F:
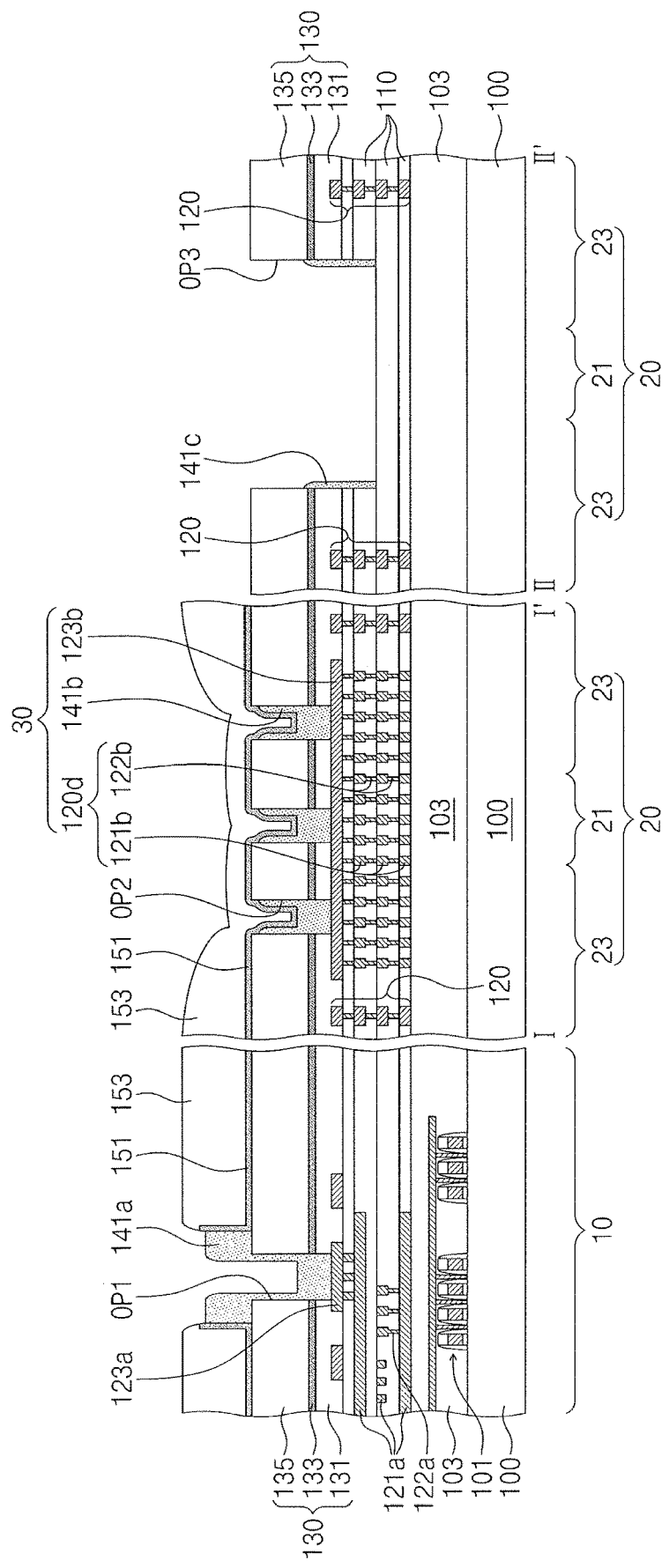

Referring to FIGS. 4A and 5F, the protection layer 151 exposed by the passivation layer 153 may be etched to expose the redistribution chip pad 141a. On the scribe line region 20, the protection layer 151 may be removed from a portion of the top surface of the upper dielectric layer 130 and from the bottom surface of the third opening OP3. The lower dielectric layer 110 may thus be partially exposed on a portion of the scribe line region 20.

After the redistribution chip pad 141a is exposed, a test process may be performed as discussed with reference to FIG. 3. After the test process is performed, the semiconductor substrate 100 may undergo a cutting process carried out along the scribe line region 20.

Figure 5G:
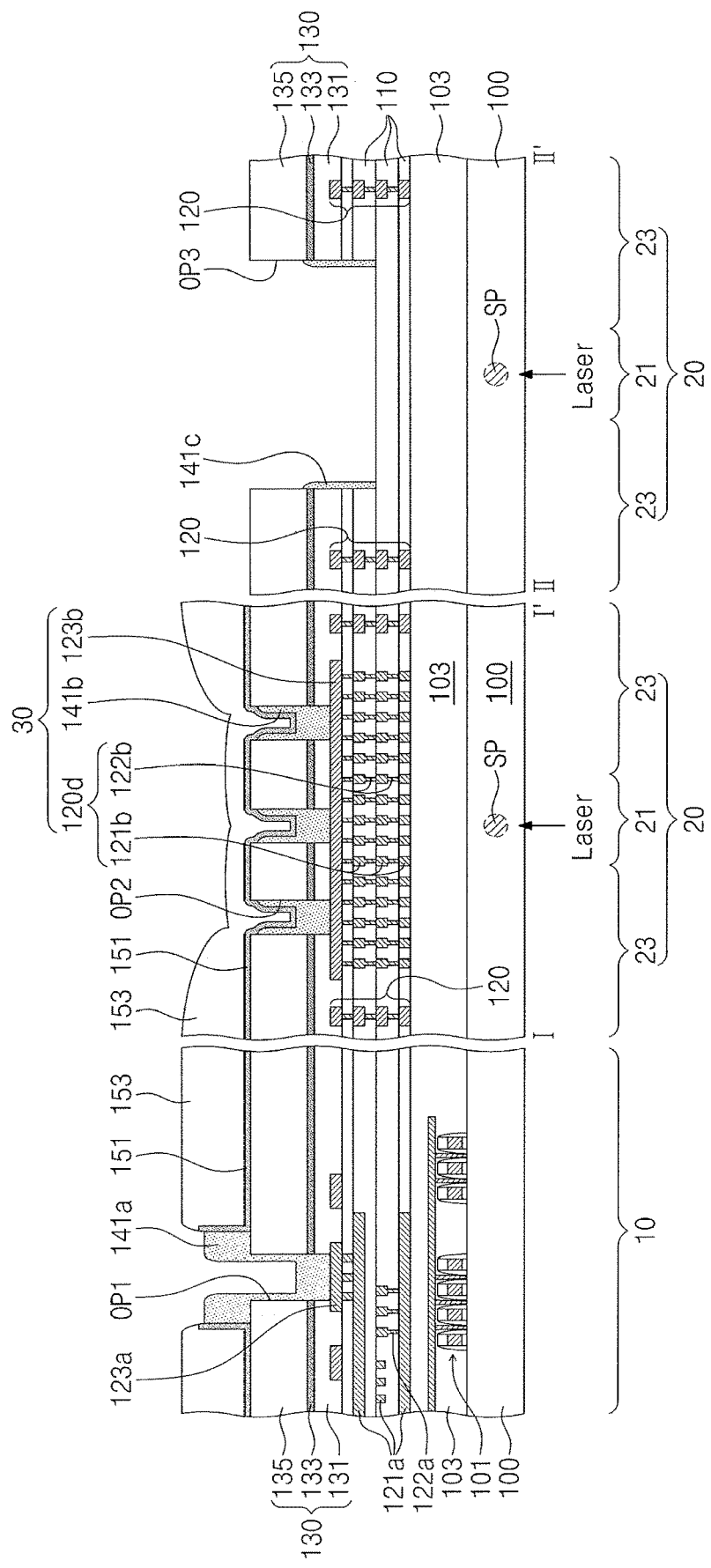

For example, referring to FIG. 5G, the semiconductor substrate 100 may be provided on its backside with a laser that travels along the cutting region 21 of the scribe line region 20. The semiconductor substrate 100 may thus change in physical characteristics at a spot region SP on which the laser is irradiated. For example, the semiconductor substrate 100 may decrease in physical strength at the laser spot region SP.

Figure 5H:
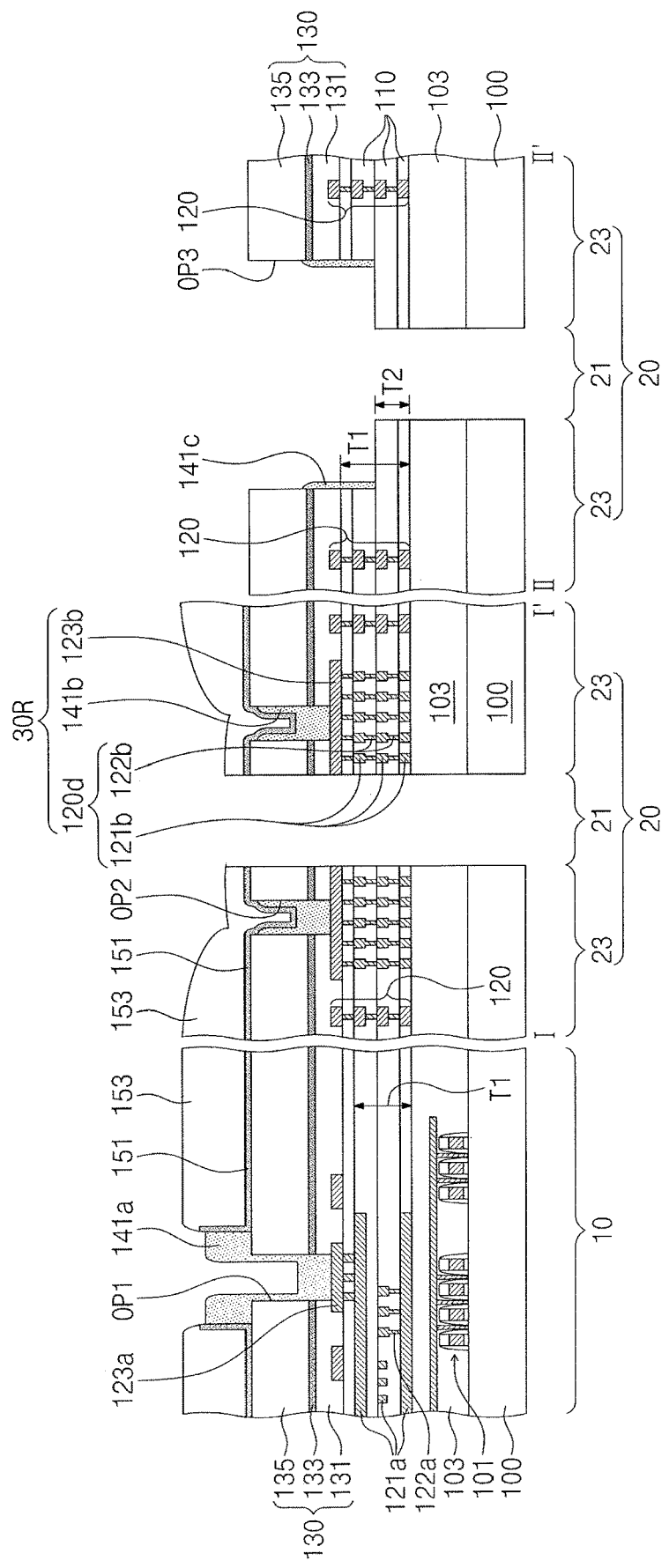

Referring to FIGS. 4B and 5H, the semiconductor substrate 100 may be placed on a thin tape, and then a force may be provided to horizontally extend the thin tape, which may result in the semiconductor substrate 100 being cut along the cutting region 21 of the scribe line region 20. In an implementation, a sawing process may be performed along the cutting region 21 of the scribe line region 20 to separate the chip regions 10 from each other. The sawing process may use a sawing wheel or a laser.

The cutting of the semiconductor substrate 100 may form semiconductor chips separated from each other. Each of the semiconductor chips may have the chip region 10 and the edge region 23 around the chip region 10.

In an implementation, when the semiconductor substrate 100 is separated into the chip regions 10, except for a region on which the process monitoring structure 30 is disposed, the cutting region 21 may have no upper dielectric layer 130 whose strength is greater than that of the lower dielectric layer 110. Thus, the semiconductor substrate 100 may be prevented from being incompletely cut due to a difference in characteristics between the lower and upper dielectric layers 110 and 130, or thin layers may be prevented from peeling off. For example, the lower and upper dielectric layers 110 and 130 may be prevented from horizontal delamination along an interface therebetween. In addition, because the lower dielectric layer 110 has a thickness (e.g., the second thickness T2) on the cutting region 21 that is less than that (e.g., the first thickness T1) on edge regions 23, the cutting process may be easily performed on the semiconductor substrate 100.

In an implementation, the process monitoring structure 30 may be cut during the cutting process. The dummy metal structures 120d may be beneath the redistribution alignment patterns 141b on the scribe line region 20 at which the upper dielectric layer 130 is present, and when the cutting process is performed, the dummy metal structures 120d may block the propagation of cracks toward the chip regions 10. For example, the semiconductor chips may increase in reliability and yield.

After the cutting of the semiconductor substrate 100, a residual process monitoring structure 30R may remain on a portion of the edge region 23 around the chip region 10, and the lower dielectric layer 110 may have a step difference on other portions of the edge region 23. In such case, on the edge region 23, the lower dielectric layer 110 may include the first segment having the first thickness T1 and the second segment having the second thickness T2 less than the first thickness T1. The upper dielectric layer 130 may cover the first segment of the lower dielectric layer 110, and the redistribution spacer 141c may remain on the second segment of the lower dielectric layer 110.

Figure 6A:
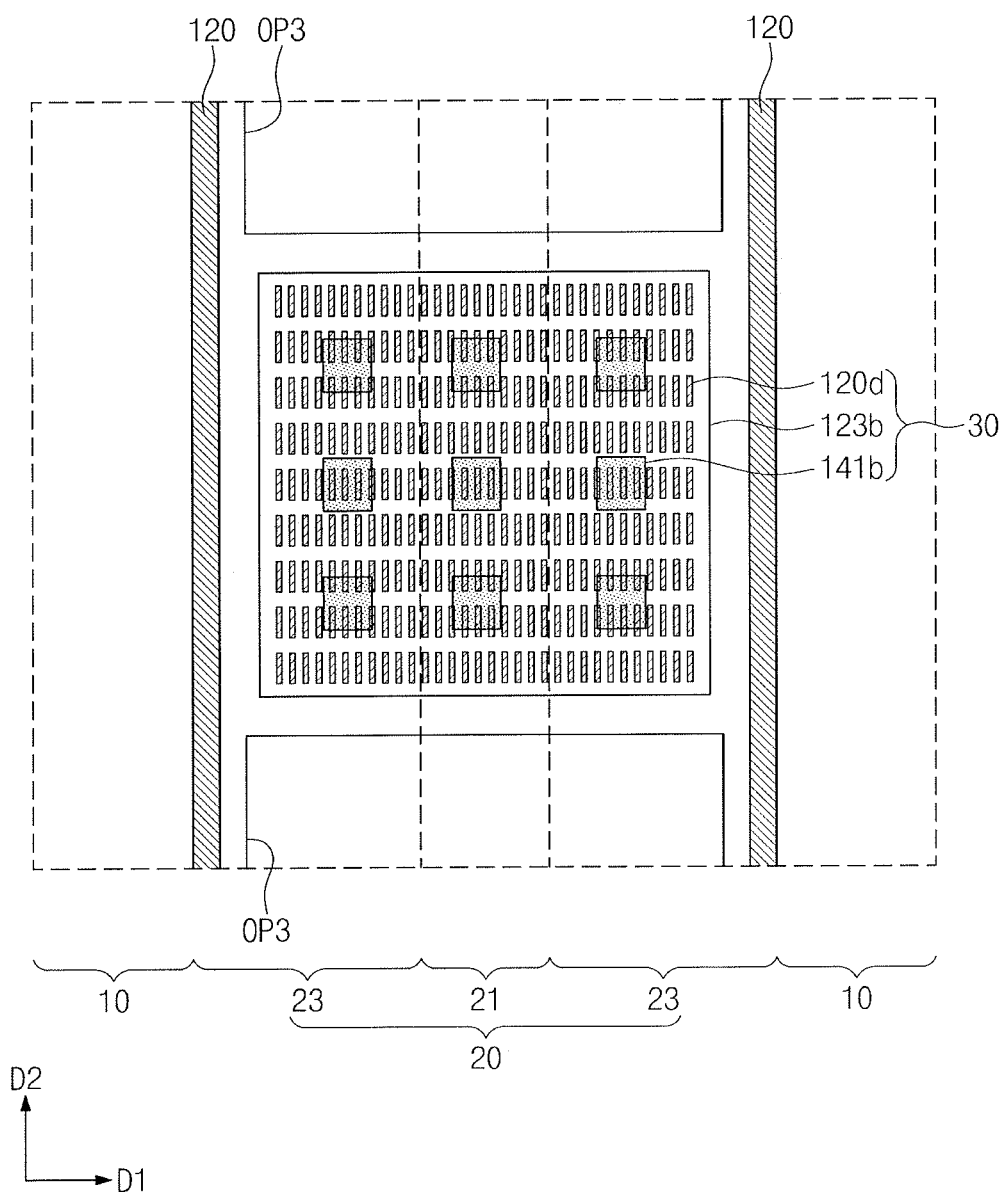
FIGS. 6A, 6B, and 6C illustrate plan views of a process monitoring structure of a semiconductor device according to some example embodiments.
Figure 6B:
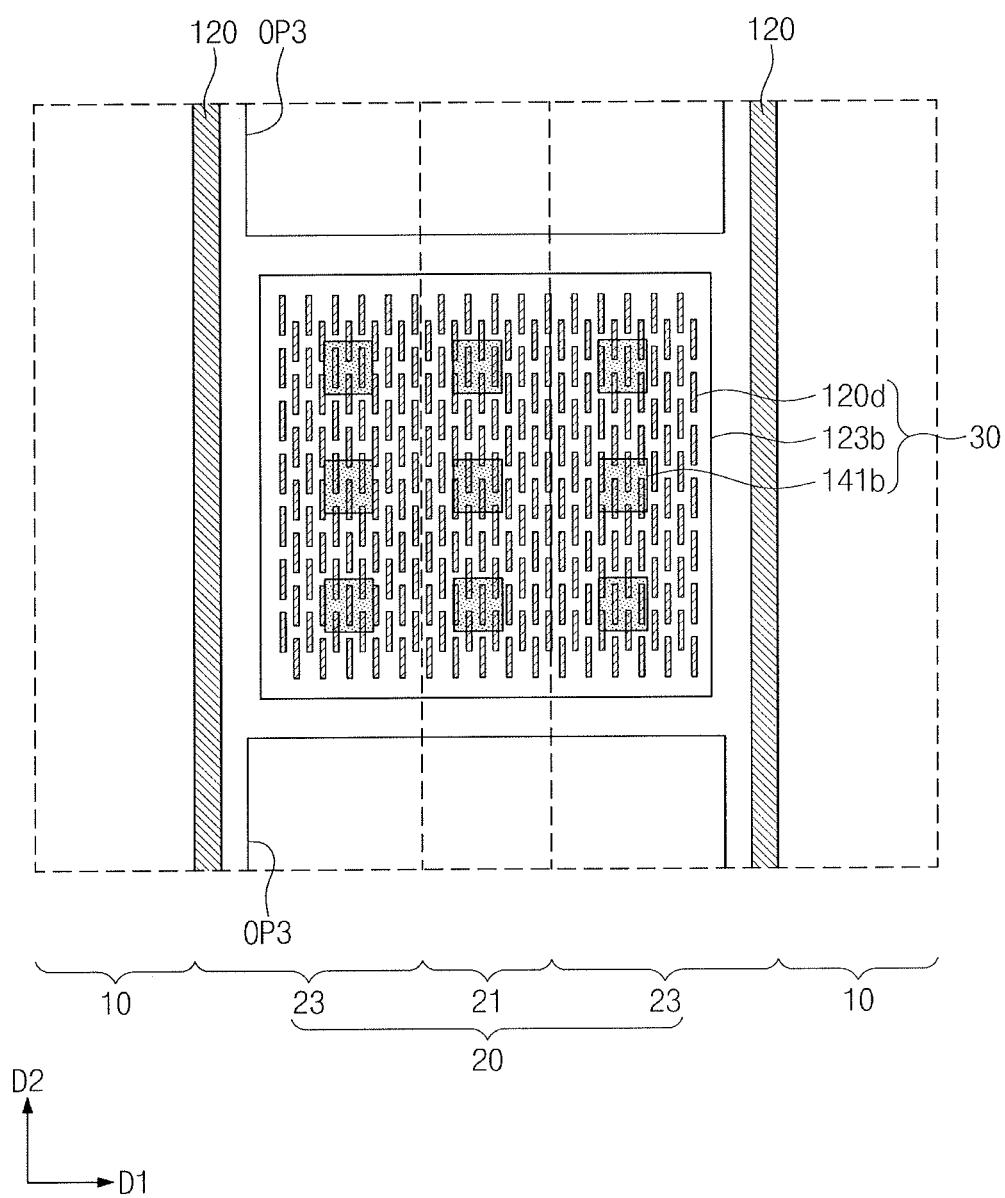
Figure 6C:
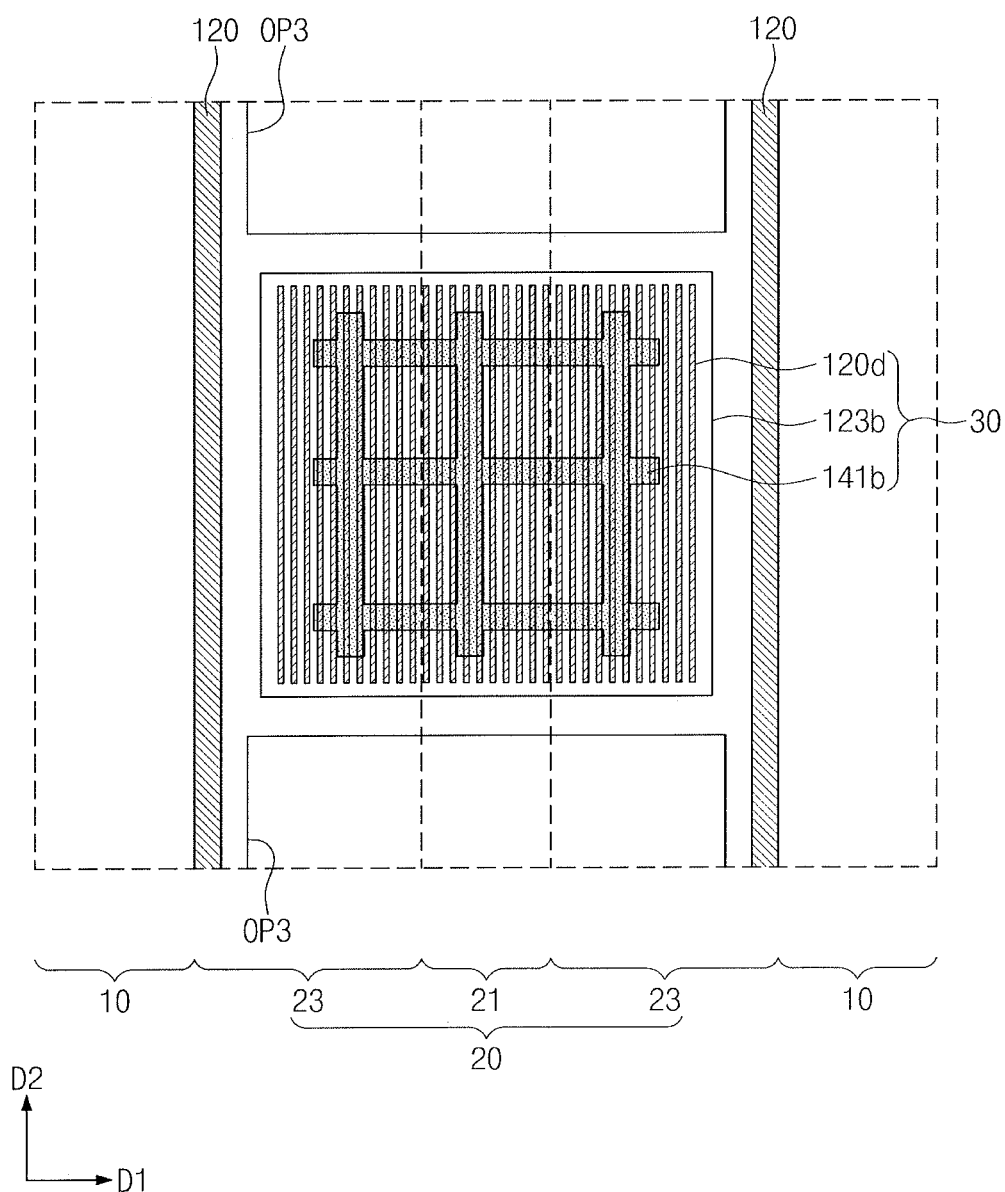

FIGS. 6A, 6B, and 6C illustrate plan views of a process monitoring structure of a semiconductor device according to some example embodiments. Repeated descriptions of the same technical features as those of the embodiments discussed above with reference to FIGS. 4A, 4B, and 5A to 5H may be omitted in the interest of brevity of description.

Referring to FIG. 6A, the process monitoring structure 30 may be on a portion of the scribe line region 20. The process monitoring structure 30 may include, as discussed above, the dummy metal structures 120d, the dummy metal pattern 123b, and the redistribution alignment patterns 141b. Each of the dummy metal structures 120d may have a bar shape having a major axis that is parallel to one of the first and second directions D1 and D2 that is parallel to an extending direction of the scribe line region 20. As shown in FIG. 5A, the dummy metal structures 120d may include the dummy metal lines 121b having bar shapes and the dummy metal vias 122b connecting the dummy metal lines 121b at different levels. The dummy metal lines 121b may be regularly spaced apart from each other along the first and second directions D1 and D2.

Referring to FIG. 6B, the dummy metal lines (see 121b of FIG. 5A) of the dummy metal structures 120d may have bar shapes, which bar shapes may be arranged in a zigzag fashion or offset alignment along the first direction D1 and spaced apart along the second direction D2 at a certain interval.

Referring to FIG. 6C, the redistribution alignment patterns 141b on the dummy metal pattern 123b may include first patterns extending in the first direction D1 and second patterns extending in the second direction D2, which first and second patterns may intersect each other. In an implementation, the redistribution alignment patterns 141b may include a first group of first patterns and a second group of second patterns, which first and second groups may be spaced apart from each other.

The following describes semiconductor devices according to some example embodiments, and repeated descriptions of the same technical features as those of the embodiments discussed above with reference to FIGS. 4A, 4B, and 5A to 5H may be omitted in the interest of brevity of description.

Figure 7A:
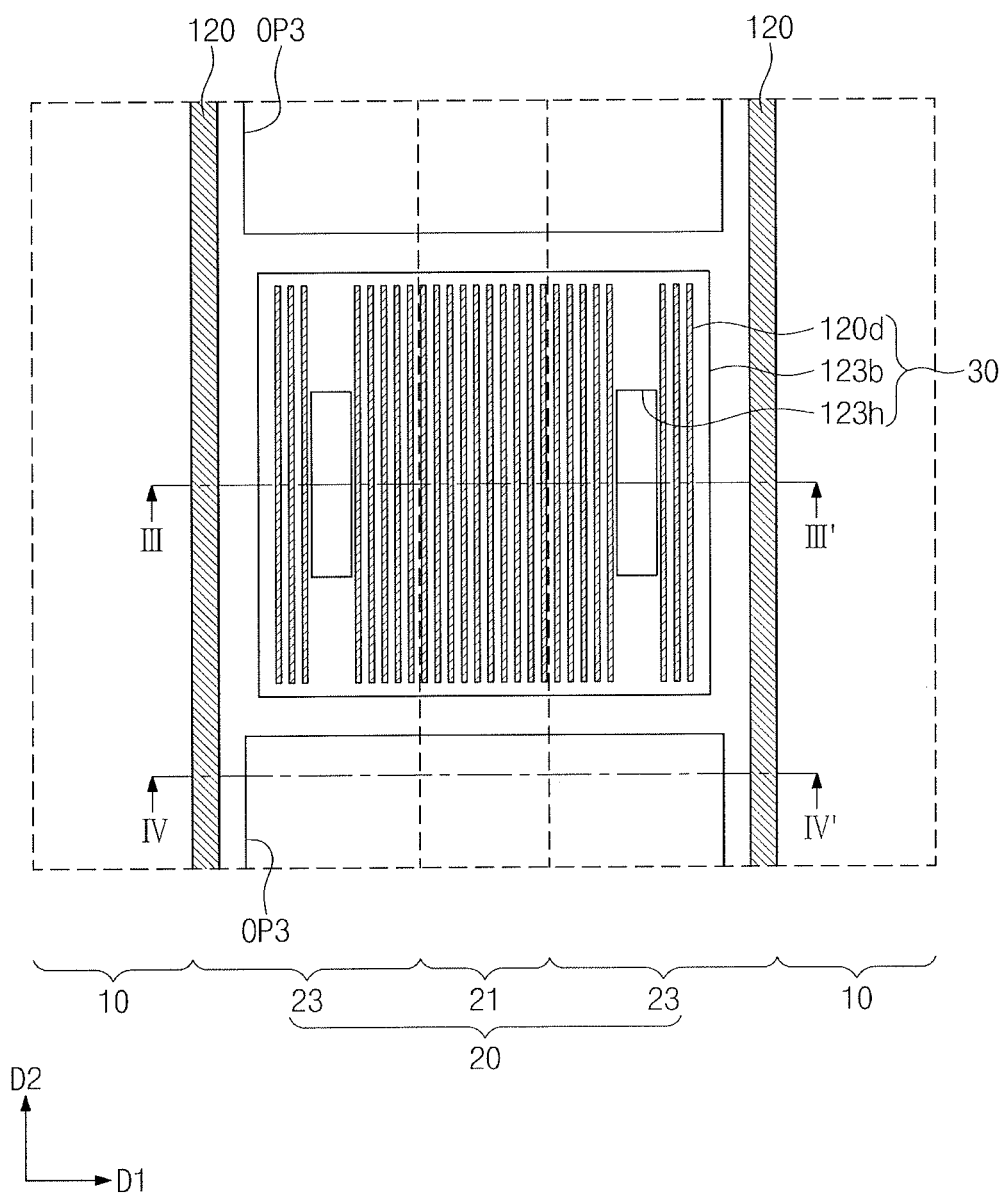
FIGS. 7A and 7B illustrate partially enlarged plan views of a semiconductor device, respectively before and after separation into semiconductor chip, according to some example embodiments.
Figure 7B:
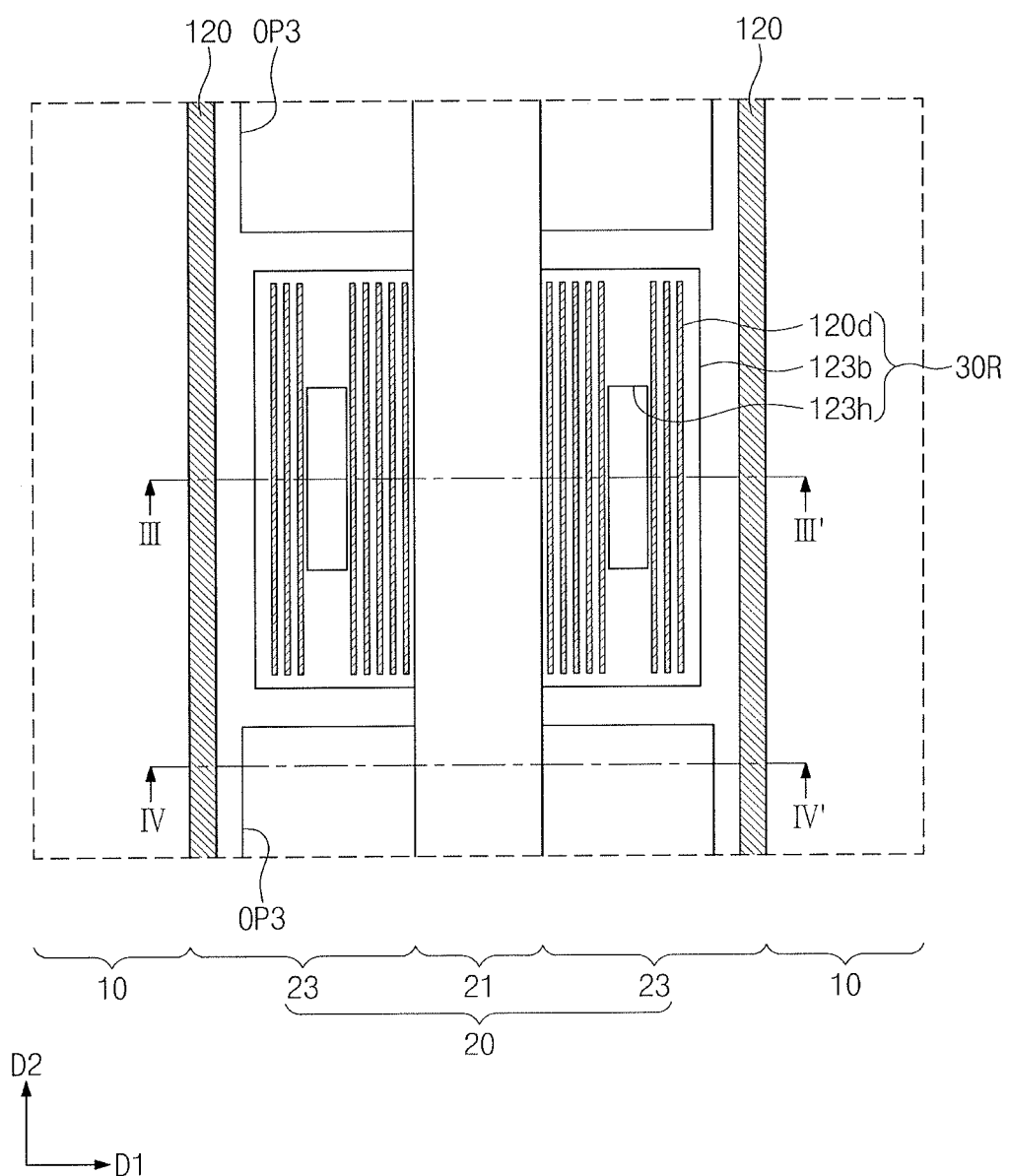
Figure 8A:
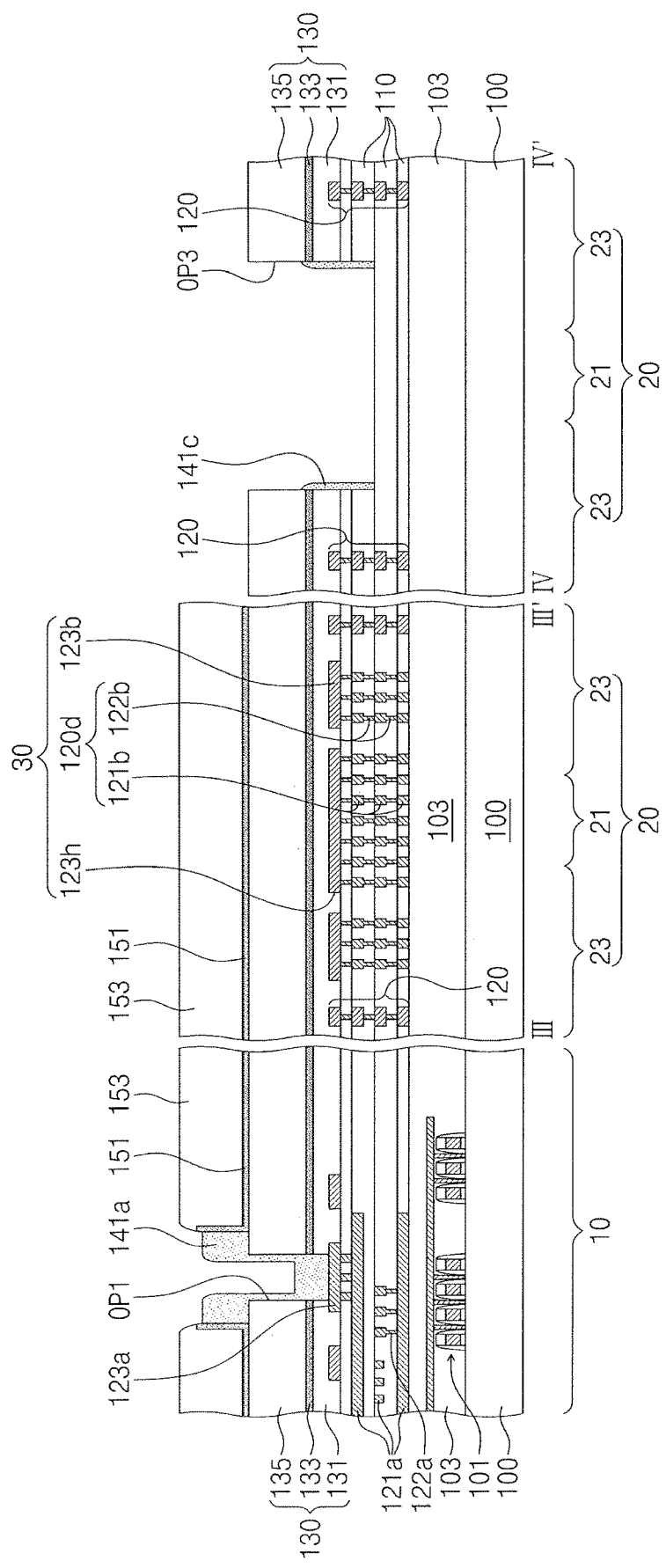
FIGS. 8A and 8B illustrate cross-sectional views taken along lines and IV-IV' of FIGS. 7A and 7B, partially showing a semiconductor device according to some example embodiments.
Figure 8B:
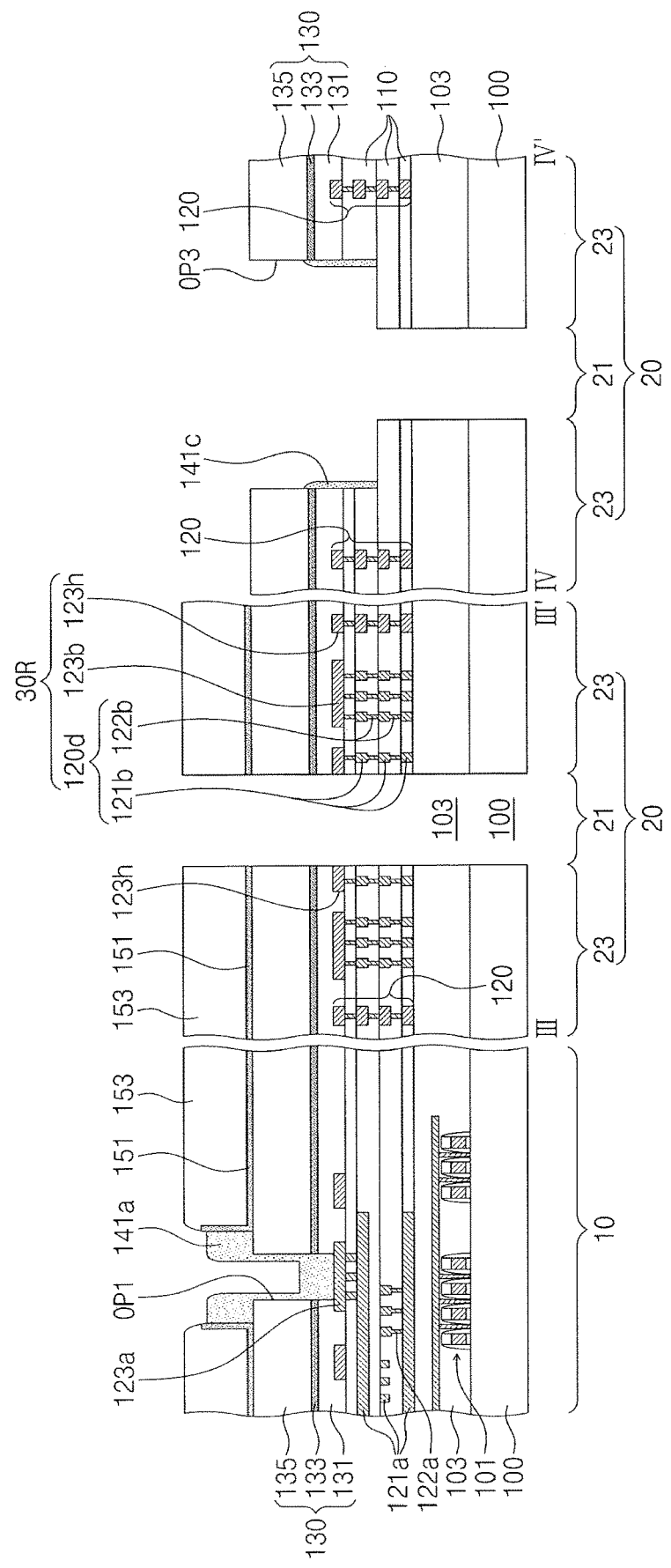

FIGS. 7A and 7B illustrate partially enlarged plan views of a semiconductor device, respectively before and after separation into semiconductor chips, according to some example embodiments. FIGS. 8A and 8B illustrate cross-sectional views taken along lines III-III' and IV-IV' of FIGS. 7A and 7B, partially showing a semiconductor device according to some example embodiments.

Referring to FIGS. 7A and 8A, on the scribe line region 20, the process monitoring structure 30 may include the dummy metal structures 120d in the lower dielectric layer 110 and the dummy metal pattern 123b on the dummy metal structures 120d. The dummy metal pattern 123b may include alignment holes 123h that are spaced apart from each other. Each of the alignment holes 123h may have a rectangular shape or a bar shape that extends in the first direction D1 or the second direction D2. The shape and arrangement of the alignment holes 123h may be variously changed. In an implementation, the alignment holes 123h of the dummy metal pattern 123b may be used as alignment criteria for ascertaining alignment between upper and lower patterns. In this case, the dummy metal structures 120d may not overlap the alignment holes 123h formed in the dummy metal pattern 123b.

Referring to FIGS. 7B and 8B, as discussed above with reference to FIGS. 5G and 5H, after a laser is irradiated on the backside of the semiconductor substrate 100, the semiconductor substrate 100 may be cut along the scribe line region 20 and thus separated into a plurality of semiconductor chips.

The residual process monitoring structure 30R may remain on the edge region 23 in each of the semiconductor chips. The residual process monitoring structure 30R may include a portion of the dummy metal pattern 123b having the alignment hole 123h.

Figure 9A:
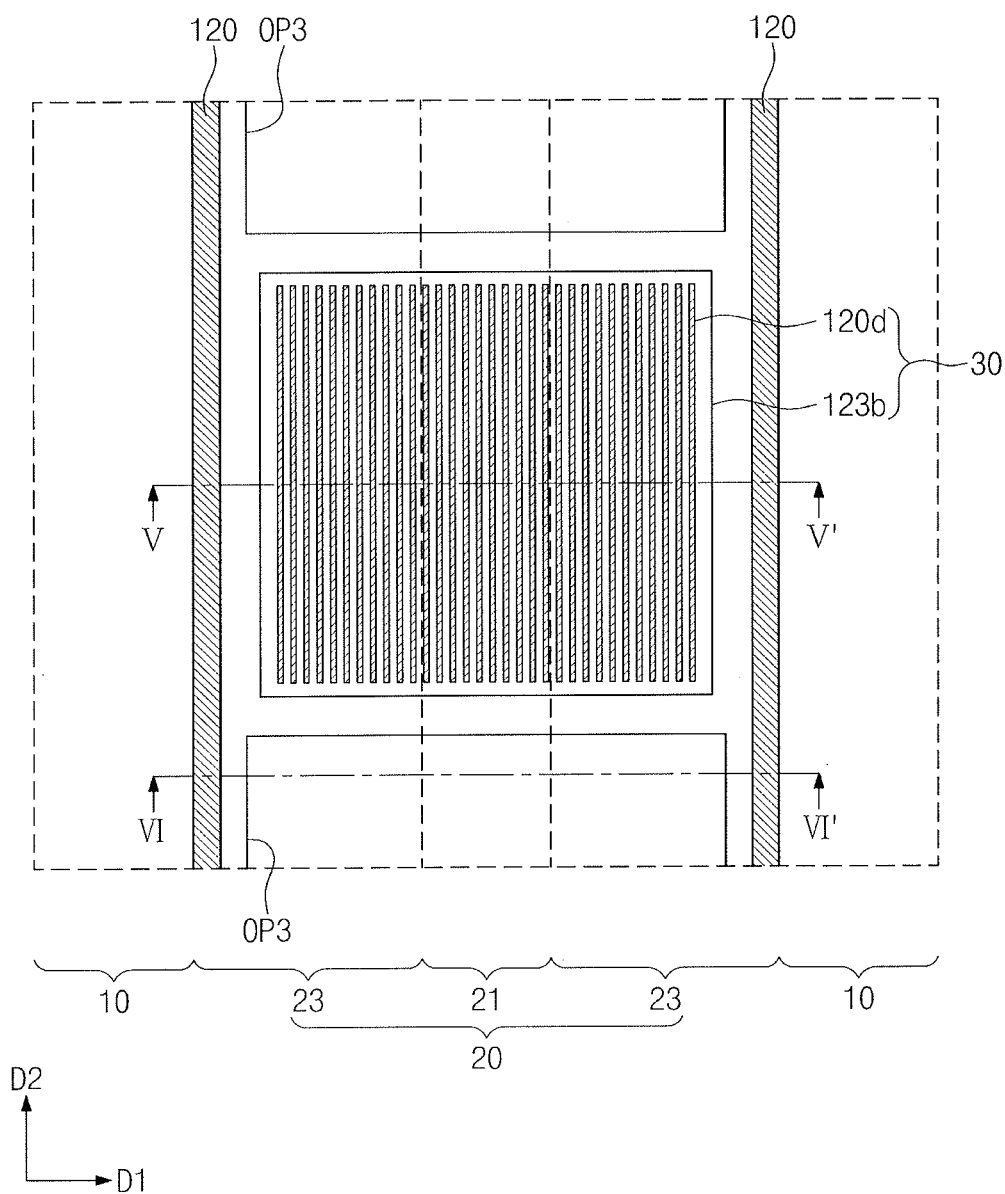
FIGS. 9A and 9B illustrate partially enlarged plan views of a semiconductor device, before and after sawing, respectively, according to some example embodiments.
Figure 9B:
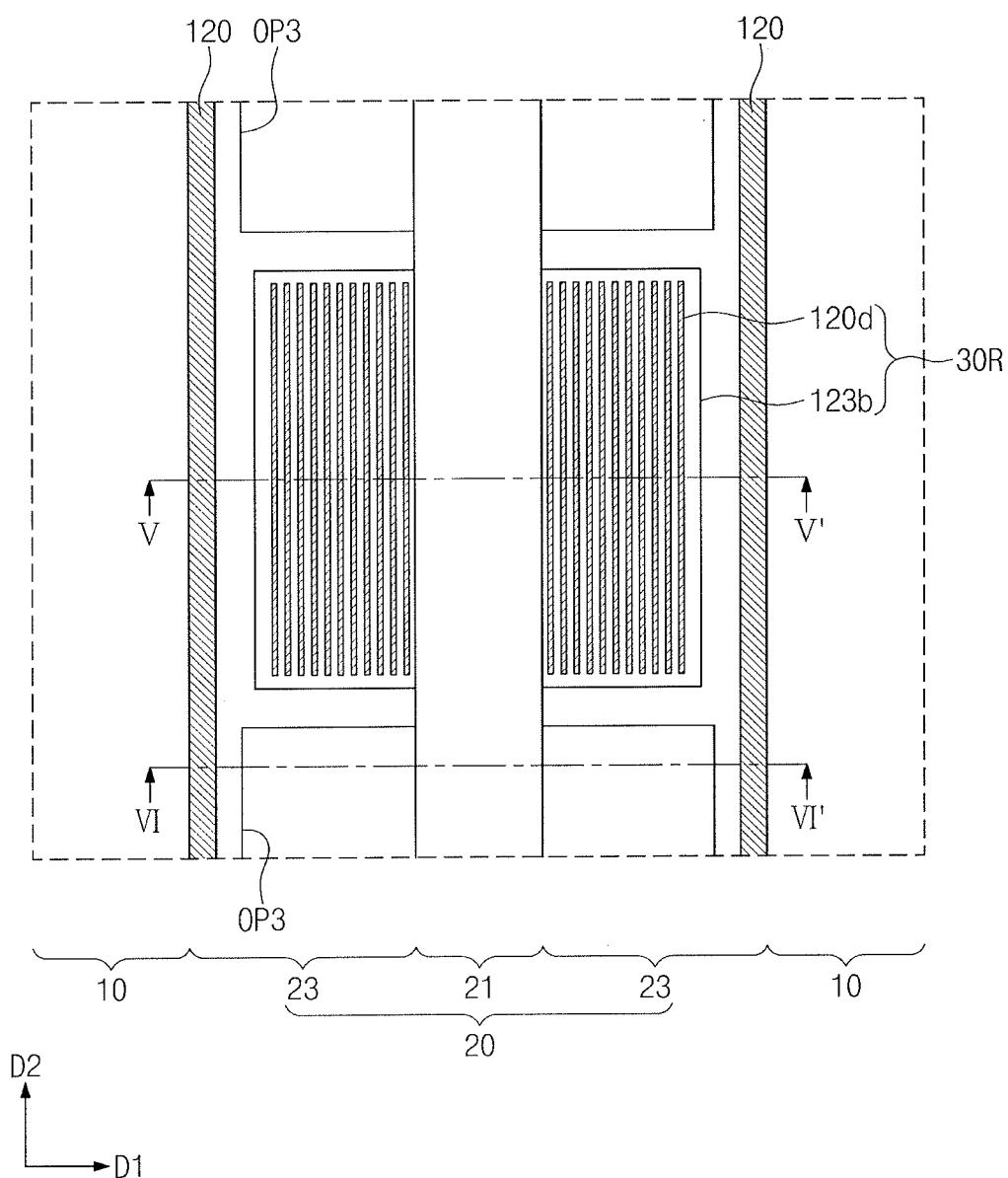
Figure 10A:
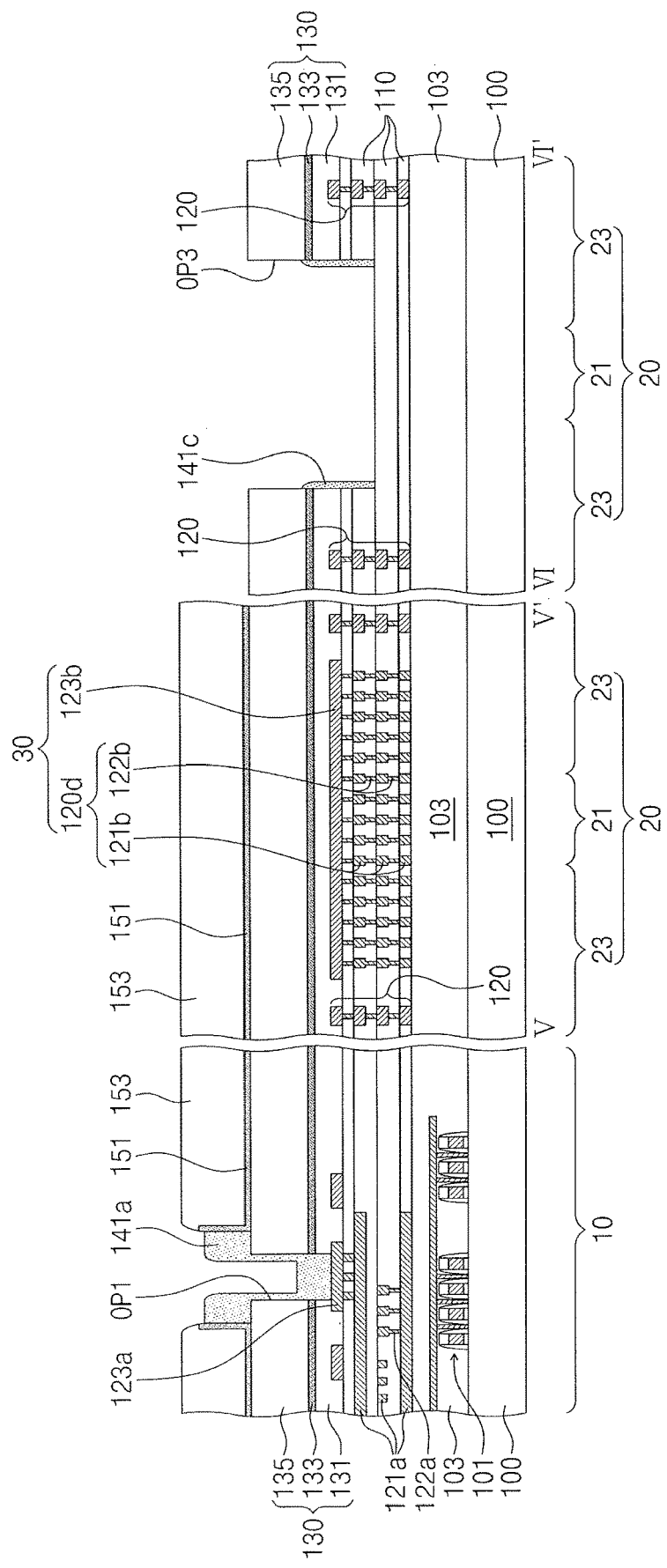
FIGS. 10A and 10B illustrate cross-sectional views taken along lines V-V' and VI-VI' of FIGS. 9A and 9B, partially showing a semiconductor device according to some example embodiments.
Figure 10B:
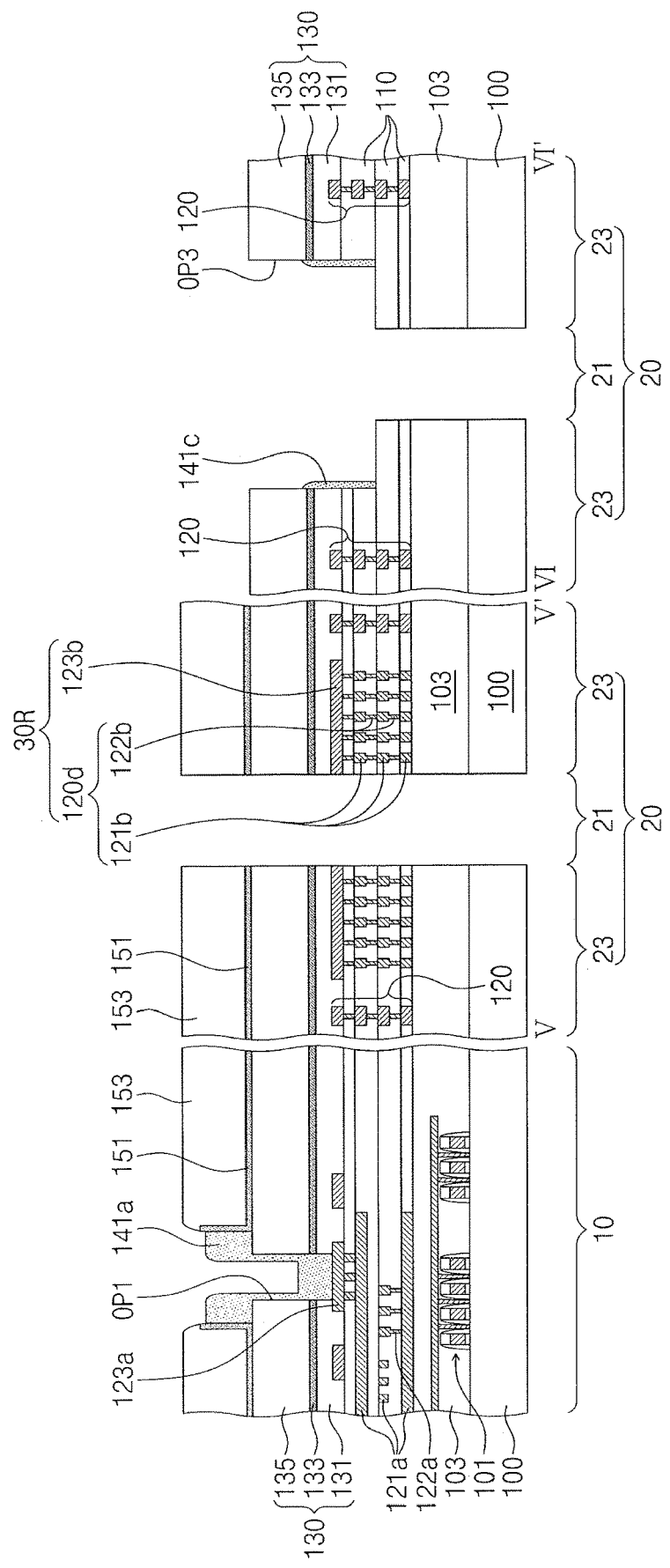

FIGS. 9A and 9B illustrate partially enlarged plan views of a semiconductor device, respectively before and after separation into semiconductor chips, according to some example embodiments. FIGS. 10A and 10B illustrate cross-sectional views taken along lines V-V' and VI-VI' of FIGS. 9A and 9B, partially showing a semiconductor device according to some example embodiments.

Referring to FIGS. 9A and 10A, on the scribe line region 20, the process monitoring structure 30 may include the dummy metal structures 120d in the lower dielectric layer 110 and the dummy metal pattern 123b on the dummy metal structures 120d. In an implementation, the dummy metal pattern 123b may be a measurement pattern for measuring line widths and/or thicknesses of patterns formed on the chip region 10. The upper dielectric layer 130 may have a substantially uniform thickness on an entire surface of the dummy metal pattern 123b.

Referring to FIGS. 9B and 10B, as discussed above with reference to FIGS. 5G and 5H, after a laser is irradiated on the backside of the semiconductor substrate 100, the semiconductor substrate 100 may be cut along the scribe line region 20 and thus separated into a plurality of semiconductor chips. When the cutting process is performed, the process monitoring structure 30 may also be cut, and the residual process monitoring structure 30R may remain on a portion of the edge region 23.

Figure 11A:
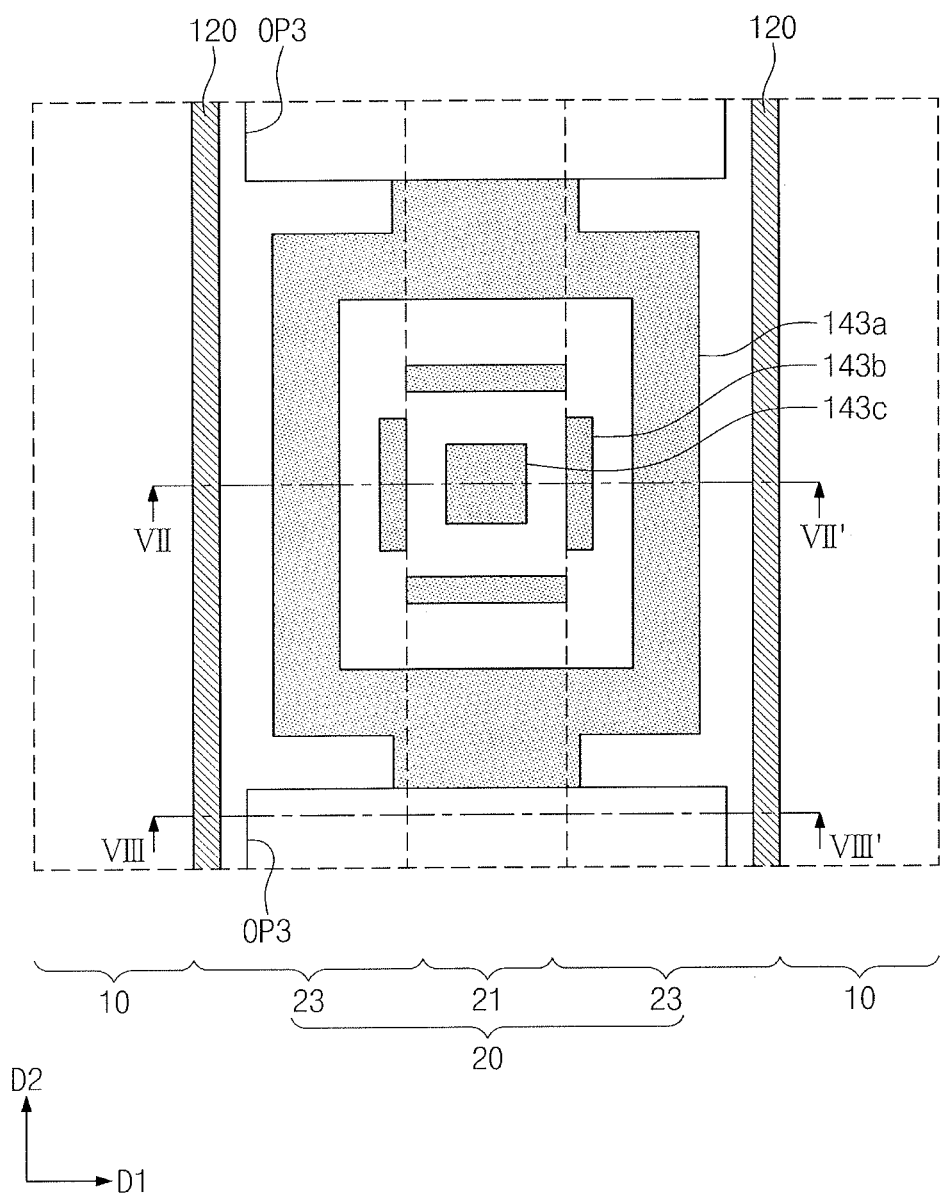
FIGS. 11A and 11B illustrate partially enlarged plan views of a semiconductor device, respectively before and after separation into semiconductor chips, according to some example embodiments.
Figure 11B:
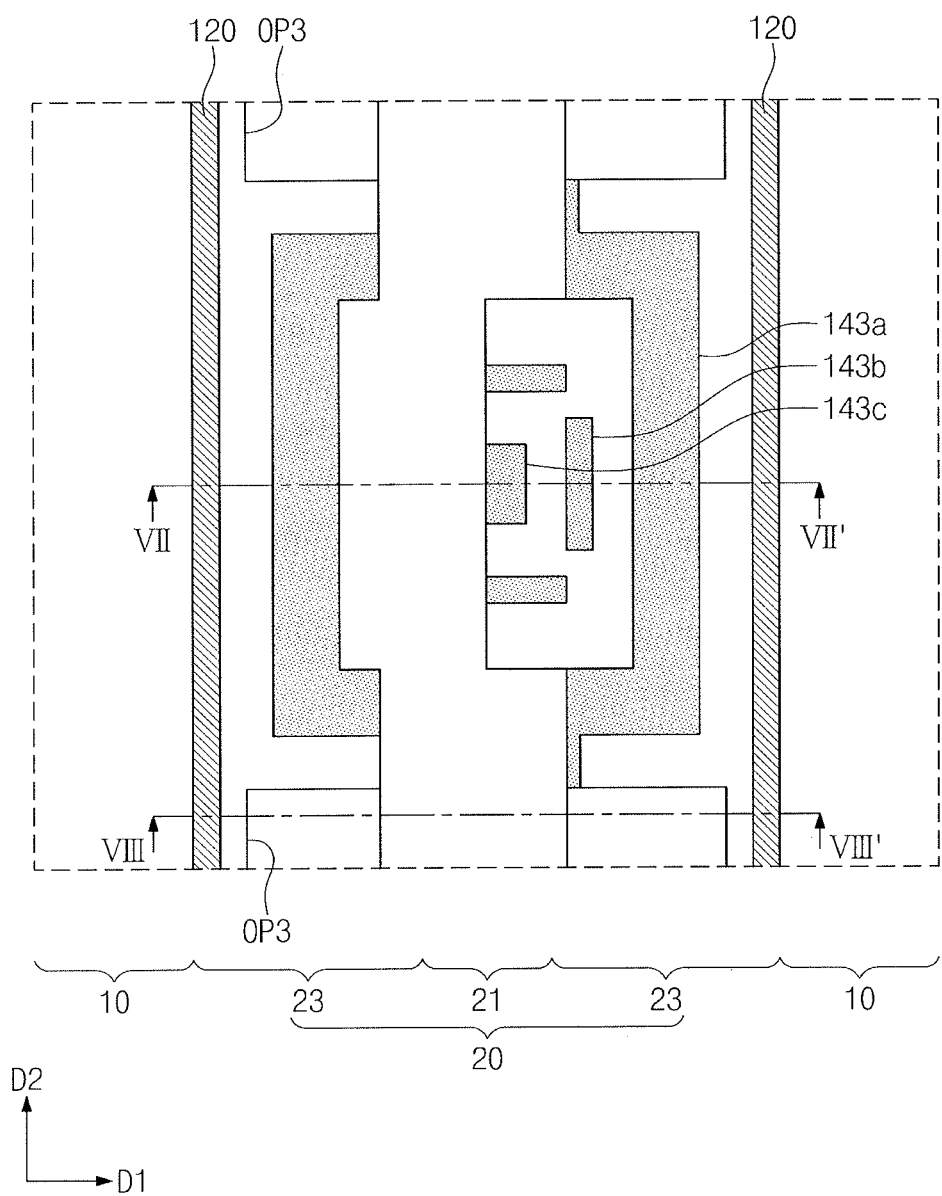
Figure 12A:
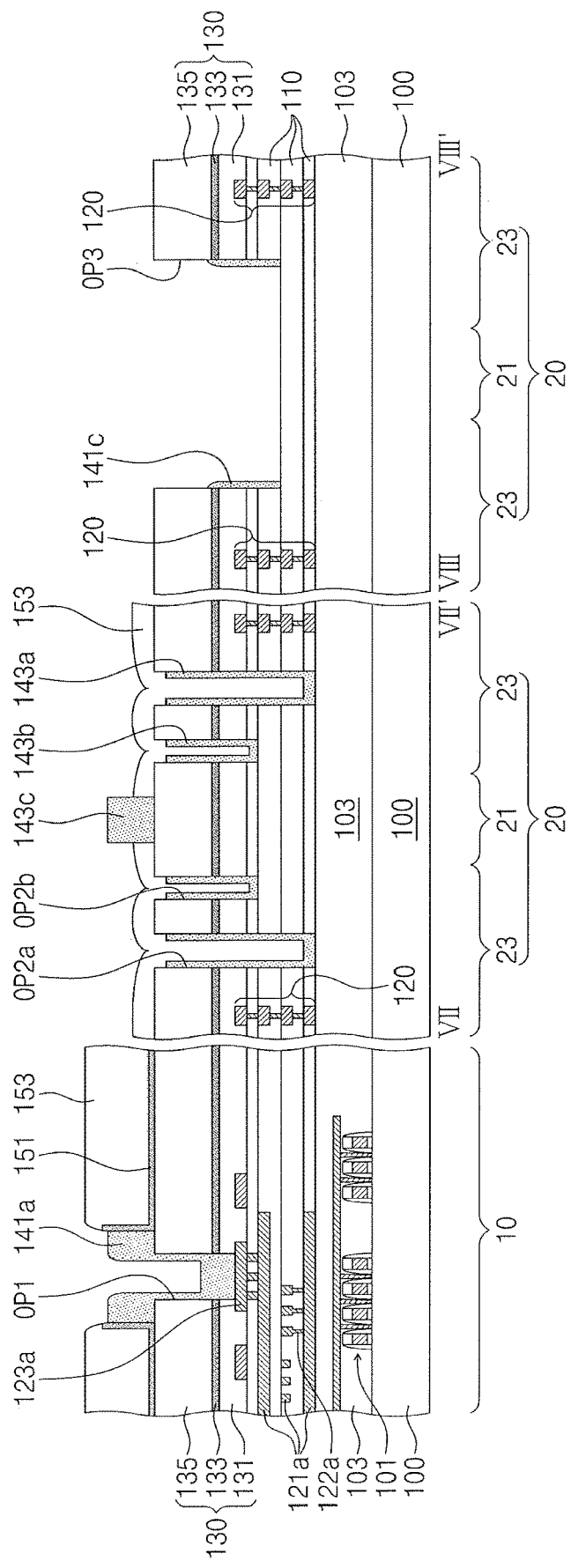
FIGS. 12A and 12B illustrate cross-sectional views taken along lines VII-VII' and VIII-VIII' of FIGS. 11A and 11B, partially showing a semiconductor device according to some example embodiments.
Figure 12B:
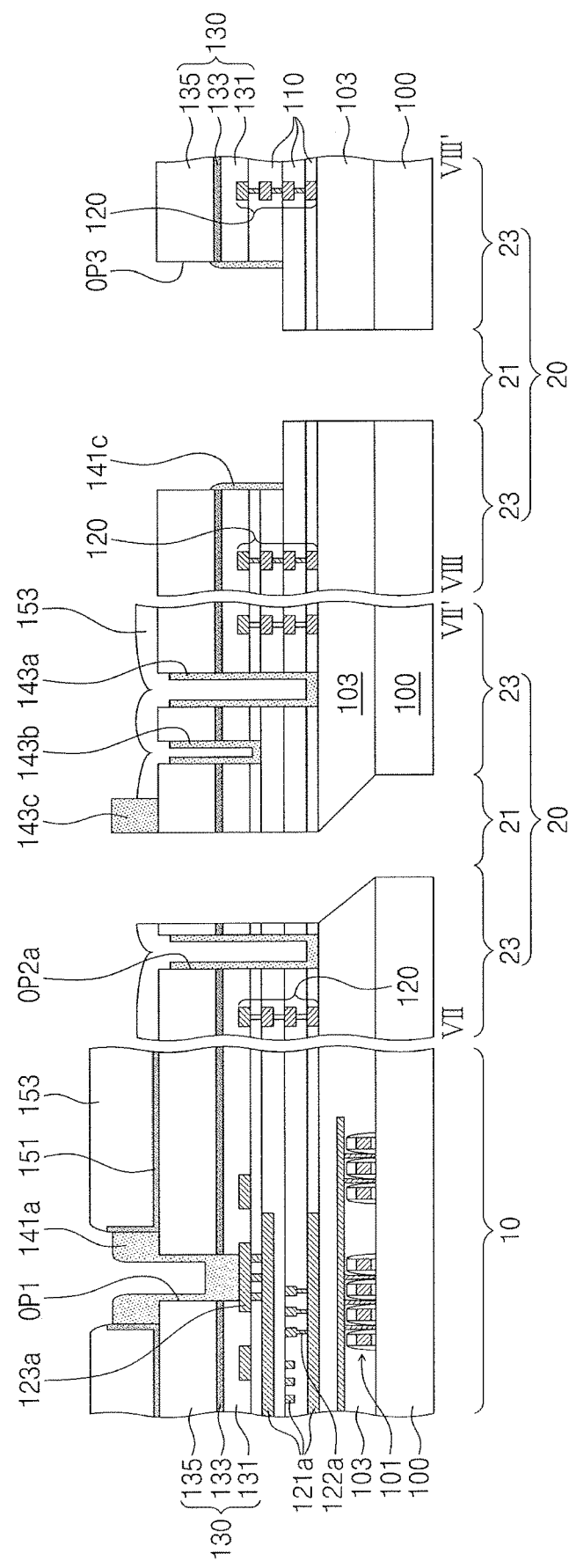

FIGS. 11A and 11B illustrate partially enlarged plan views of a semiconductor device, respectively before and after separation into semiconductor chips, according to some example embodiments. FIGS. 12A and 12B illustrate partial cross-sectional views taken along lines VII-VII' and VIII-VIII' of FIGS. 11A and 11B, showing a semiconductor device according to some example embodiments.

Referring to FIGS. 11A and 12A, a process monitoring pattern 143c may be on the upper dielectric layer 130 of the scribe line region 20. The process monitoring pattern 143c may be an overlay pattern for ascertaining an overlap between subsequent upper and lower patterns. A portion of the redistribution layer 140 of the scribe line region 20 may be patterned when the redistribution chip pad 141a of the chip region 10 is formed as discussed with reference to FIGS. 5C and 5D, which may result in the formation of the process monitoring pattern 143c. The process monitoring pattern 143c may include the same metallic material as that of the redistribution chip pad 141a.

First dummy openings OP2a penetrating the upper and lower dielectric layers 130 and 110 may be formed around the process monitoring pattern 143c, and second dummy openings OP2b penetrating the upper dielectric layer 130 may be formed between the process monitoring pattern 143c and the first dummy openings OP2a.

As discussed above with reference to FIG. 5B, the first and second dummy openings OP2a and OP2b may be formed simultaneously with the first openings OP1 of the chip region 10. The first dummy openings OP2a may have widths greater than those of the second dummy openings OP2b, and may have bottom surfaces at a lower level lower than that of bottom surfaces of the second dummy openings OP2b. For example, the first dummy openings OP2a may expose the lower dielectric layer 110 or the interlayer dielectric layer 103, and the second dummy openings OP2b may expose the lower dielectric layer 110. When viewed in plan, each of the first dummy openings OP2a may have a closed curve shape that surrounds the process monitoring pattern 143c. Each of the second dummy openings OP2b may have a bar shape having a major axis that is parallel to the first direction D1 or the second direction D2.

First dummy redistribution patterns 143a may be formed in the first dummy openings OP2a, and second dummy redistribution patterns 143b may be formed in the second dummy openings OP2b. As discussed above with reference to FIGS. 5C and 5D, the first and second dummy redistribution patterns 143a and 143b may be formed simultaneously with the redistribution chip pad 141a of the chip region 10. The first and second dummy redistribution patterns 143a and 143b may include the same metallic material as that of the redistribution chip pad 141a.

The first dummy redistribution pattern 143a may include a bottom segment in contact with the interlayer dielectric layer 103 and sidewall segments extending from the bottom segment onto inner walls of the first dummy opening OP2a. The second dummy redistribution pattern 143b may include a bottom segment in contact with the lower dielectric layer 110 and sidewall segments extending from the bottom segment onto inner walls of the second dummy opening OP2b. The first and second dummy redistribution patterns 143a and 143b may have their top surfaces at a level lower than that of the top surface of the upper dielectric layer 130.

The first and second dummy redistribution patterns 143a and 143b may partially fill the first and second dummy openings OP2a and OP2b. The passivation layer 153 may fill a gap defined by the bottom segment and the sidewall segments of each of the first and second dummy redistribution patterns 143a and 143b.

Referring to FIGS. 11B and 12B, as discussed above with reference to FIGS. 5G and 5H, after a laser is irradiated on the backside of the semiconductor substrate 100, the semiconductor substrate 100 may be cut along the scribe line region 20.

When the cutting process is performed on the semiconductor substrate 100, at areas where the lower and upper dielectric layers 110 and 130 are present, the cutting region 21 may change its direction toward the first dummy redistribution pattern 143a. In this case, neighboring semiconductor chips may be asymmetrically cut to have a change in width of a portion of the edge region 23.

In an implementation, the first and second dummy redistribution patterns 143a and 143b penetrating the upper dielectric layer 130 may be formed around the process monitoring pattern 143c that is used as an overlay pattern, and when the semiconductor substrate 100 is cut along the cutting region 21, the first and second dummy redistribution patterns 143a and 143b may block the propagation of cracks toward the chip region 10.

Figure 13A:
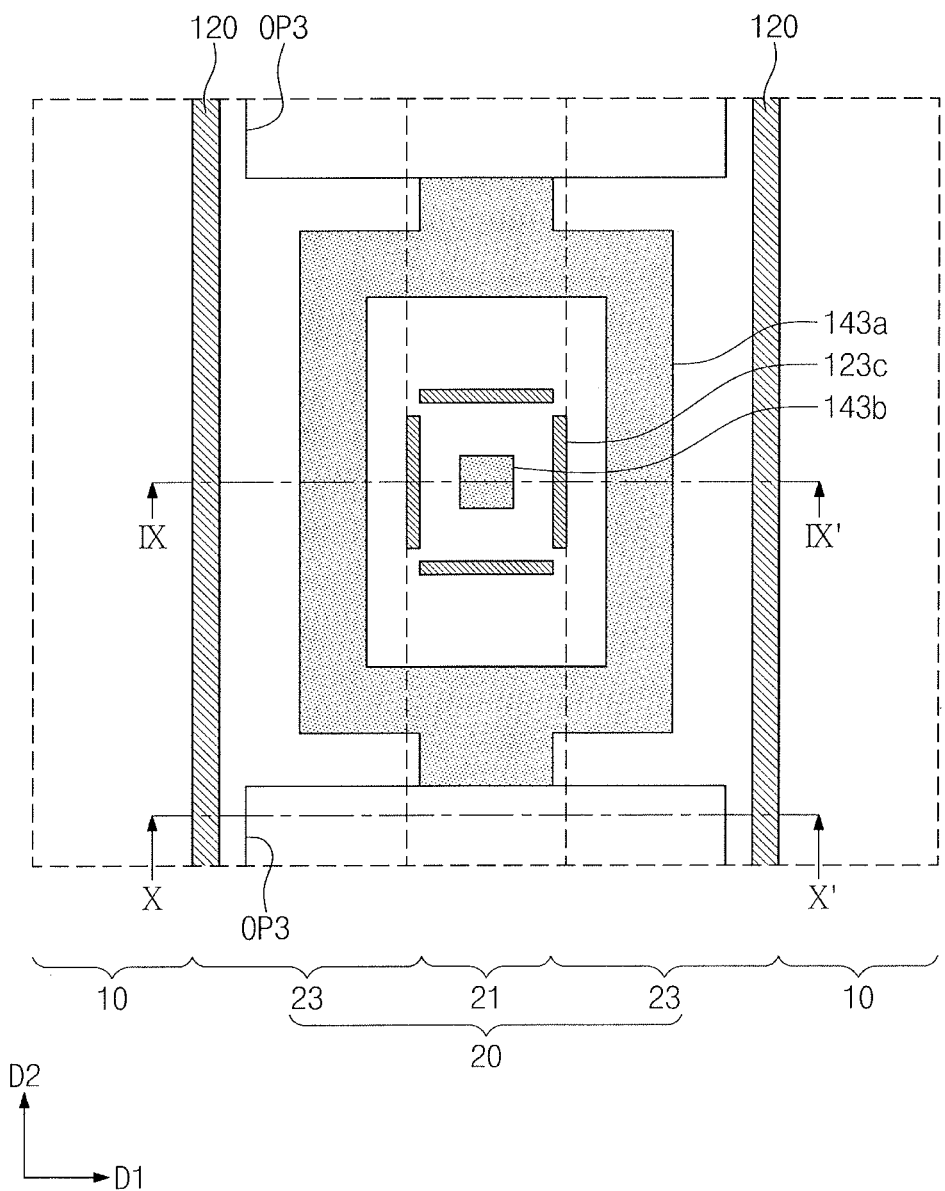
FIGS. 13A and 13B illustrate partially enlarged plan views of a semiconductor device, respectively before and after separation into semiconductor chips, according to some example embodiments.
Figure 13B:
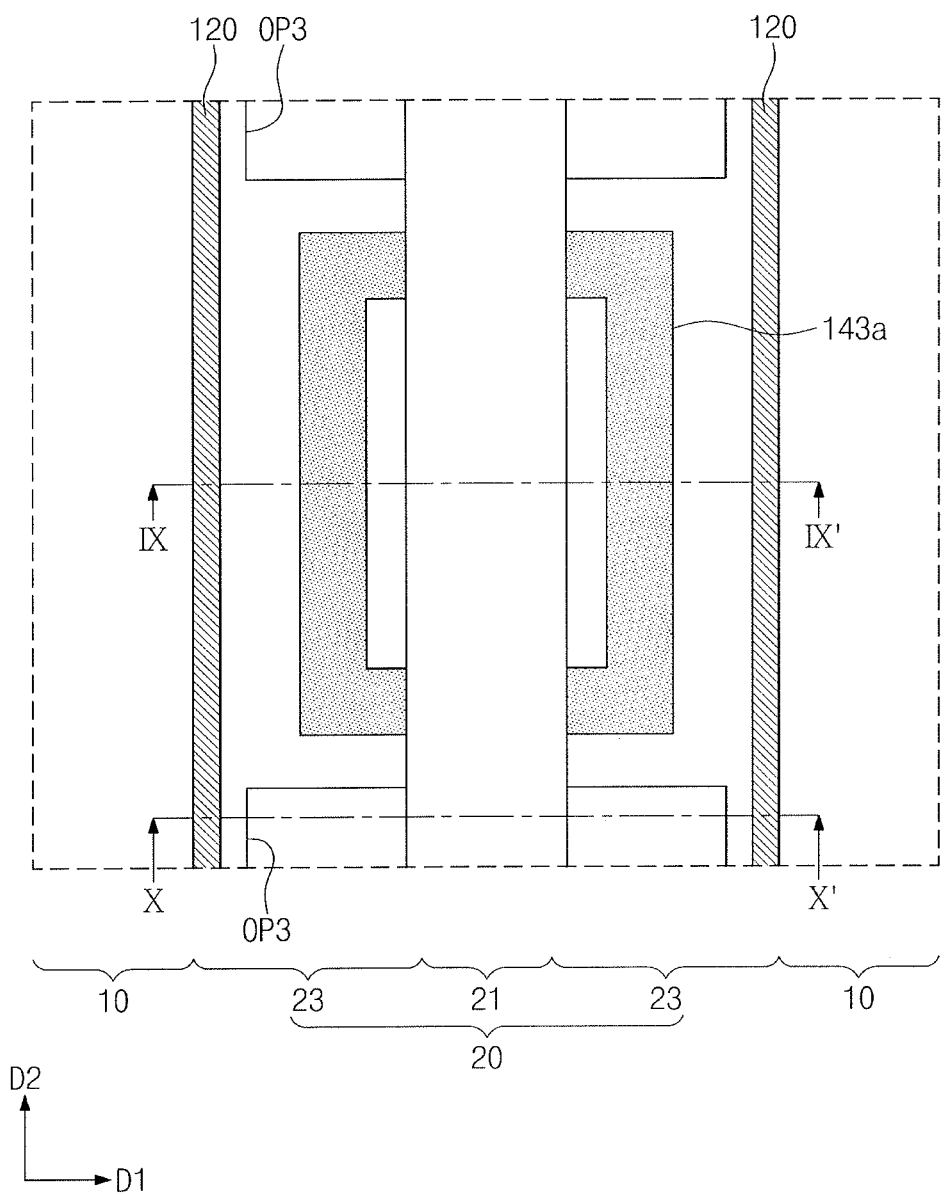
Figure 14A:
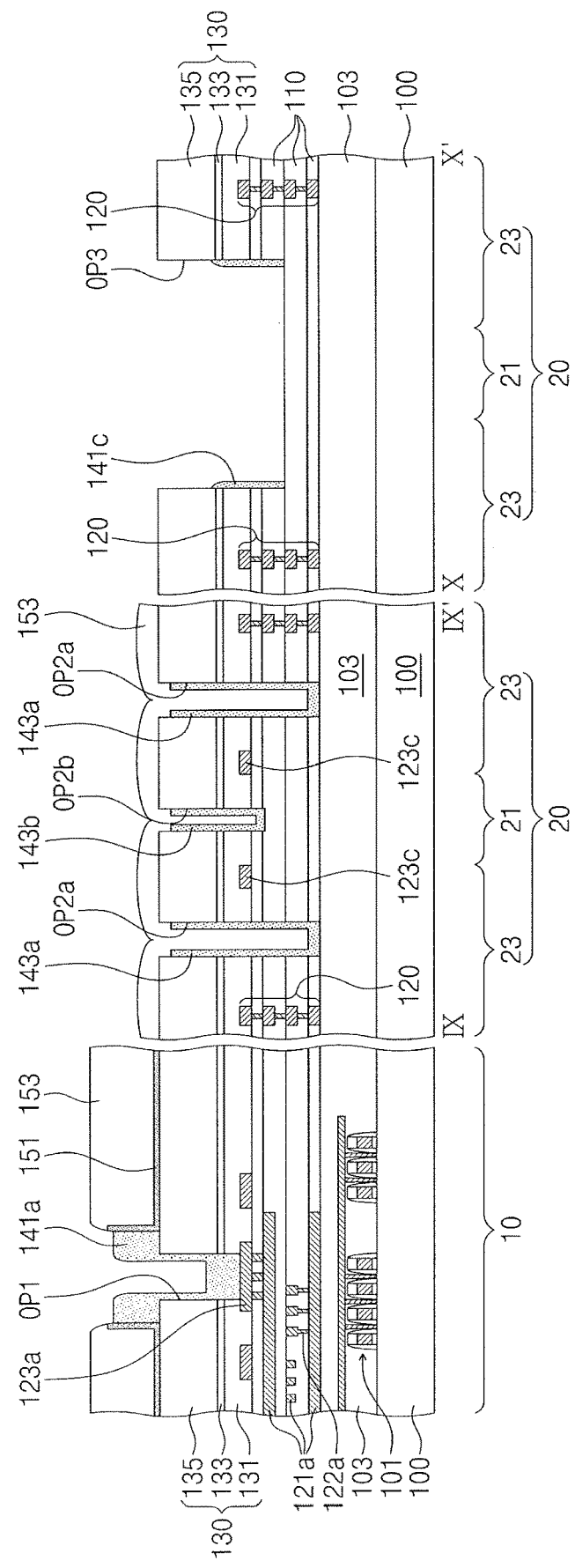
FIGS. 14A and 14B illustrate cross-sectional views taken along lines IX-IX' and X-X' of FIGS. 13A and 13B, partially showing a semiconductor device according to some example embodiments.
Figure 14B:
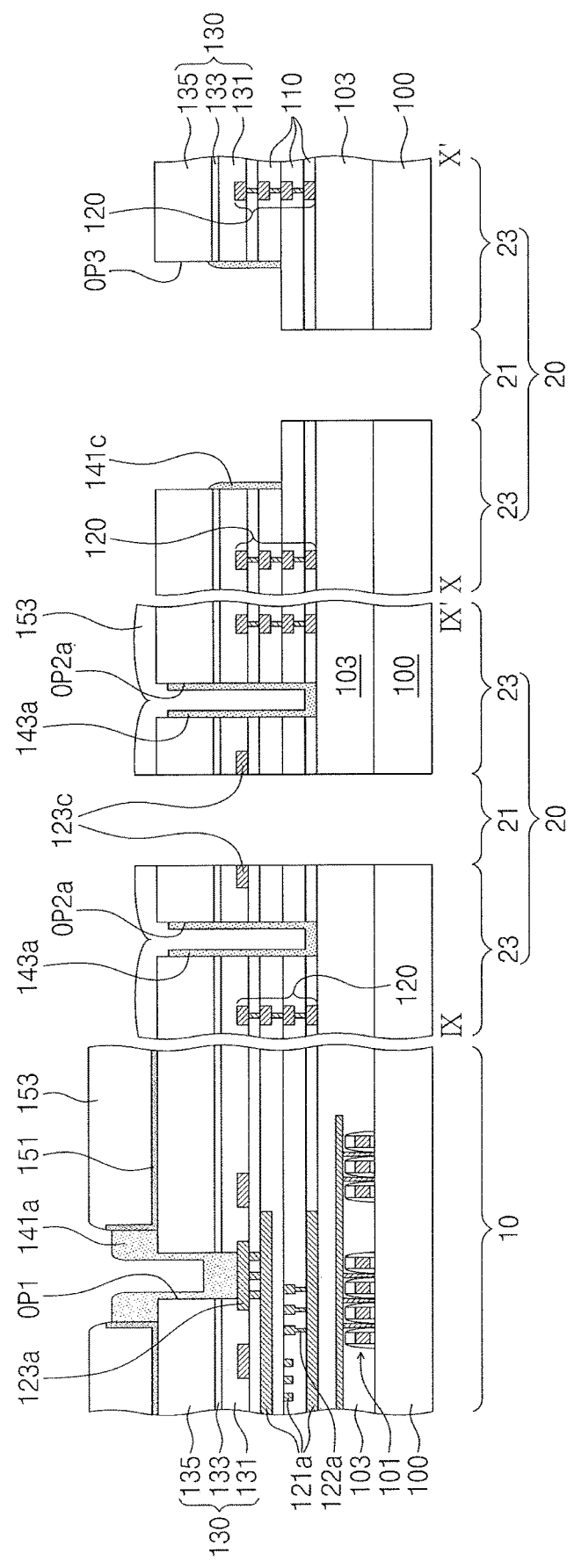

FIGS. 13A and 13B illustrate partially enlarged plan views of a semiconductor device, respectively before and after separation into semiconductor chips, according to some example embodiments. FIGS. 14A and 14B illustrate cross-sectional views taken along lines IX-IX' and X-X' of FIGS. 13A and 13B, partially showing a semiconductor device according to some example embodiments.

Referring to FIGS. 13A and 14A, lower process monitoring patterns 123c may be formed on the lower dielectric layer 110, and the upper dielectric layer 130 may cover the lower process monitoring patterns 123c. The lower process monitoring patterns 123c may be overlay patterns for ascertaining overlaps between subsequent upper and lower patterns. The lower process monitoring patterns 123c may be formed simultaneously with the chip pads 123a discussed with reference to FIG. 5A. The lower process monitoring patterns 123c may include the same metallic material as that of the chip pads 123a. For example, the lower process monitoring patterns 123c may have bar shapes extending in the first and second directions D1 and D2.

The first dummy openings OP2a penetrating the upper and lower dielectric layers 130 and 110 may be formed around the lower process monitoring patterns 123c. The second dummy opening OP2a penetrating the upper dielectric layer 130 may be formed between the lower process monitoring patterns 123c. The first dummy openings OP2a may have widths that are greater than those of the second dummy openings OP2b. As discussed above with reference to FIG. 5B, the first and second dummy openings OP2a and OP2b may be formed simultaneously with the first openings OP1 of the chip region 10.

The first dummy redistribution patterns 143a may be formed in the first dummy openings OP2a, and the second dummy redistribution patterns 143b may be formed in the second dummy openings OP2b. As discussed above with reference to FIGS. 5C and 5D, the first and second dummy redistribution patterns 143a and 143b may be formed simultaneously with the redistribution chip pad 141a of the chip region 10. The first and second dummy redistribution patterns 143a and 143b may include the same metallic material as that of the redistribution chip pad 141a. The passivation layer 153 may fill the first and second dummy openings OP2a and OP2b in which the first and second dummy redistribution patterns 143a and 143b are respectively formed.

Referring to FIGS. 13B and 14B, as discussed above with reference to FIGS. 5G and 5H, after a laser is irradiated on the backside of the semiconductor substrate 100, the semiconductor substrate 100 may be cut along the scribe line region 20 and thus separated into a plurality of semiconductor chips.

When the semiconductor substrate 100 is cut, the first dummy redistribution patterns 143a may block the propagation of cracks toward the chip region 10 and may protect the chip region 10 from the progression of delamination between the upper dielectric layer 130 and the lower dielectric layer 110.

Figure 15A:
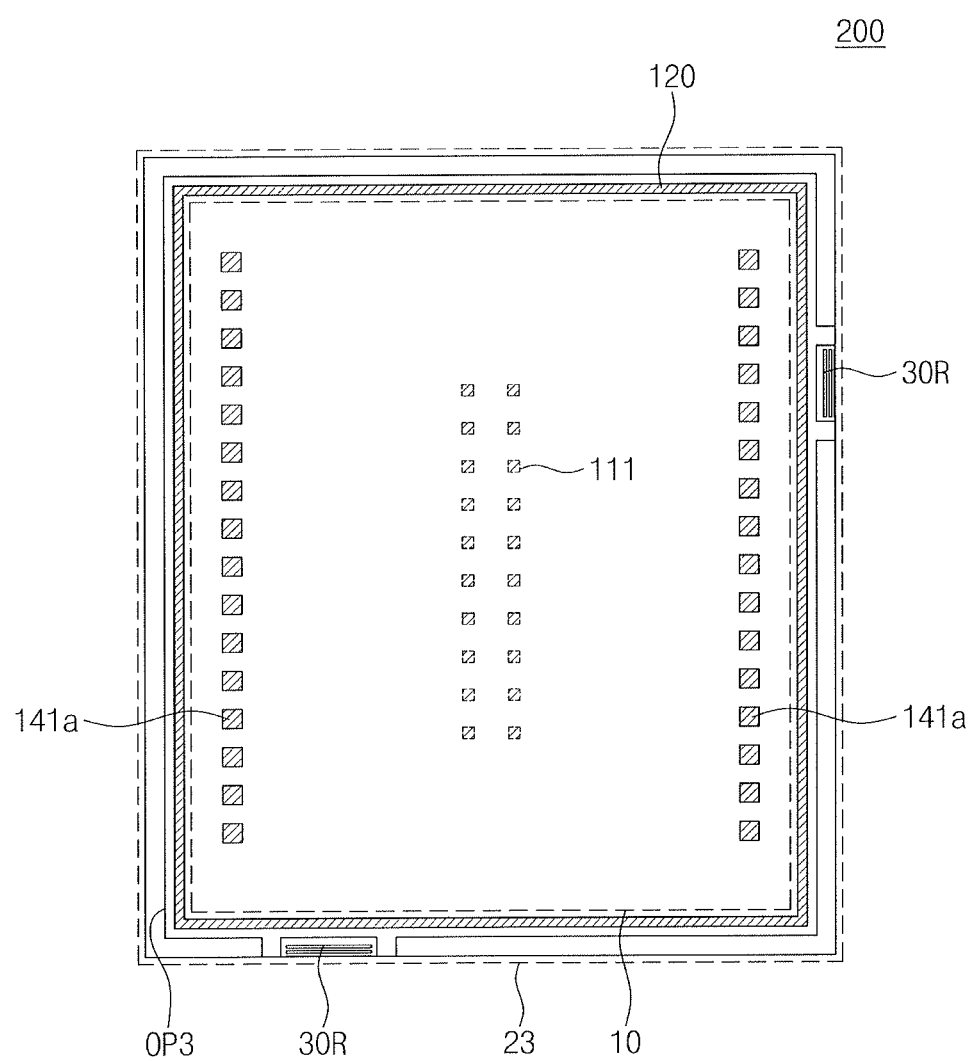
FIG. 15A illustrates a plan view of a semiconductor chip separated from a semiconductor device according to some example embodiments.
Figure 15B:
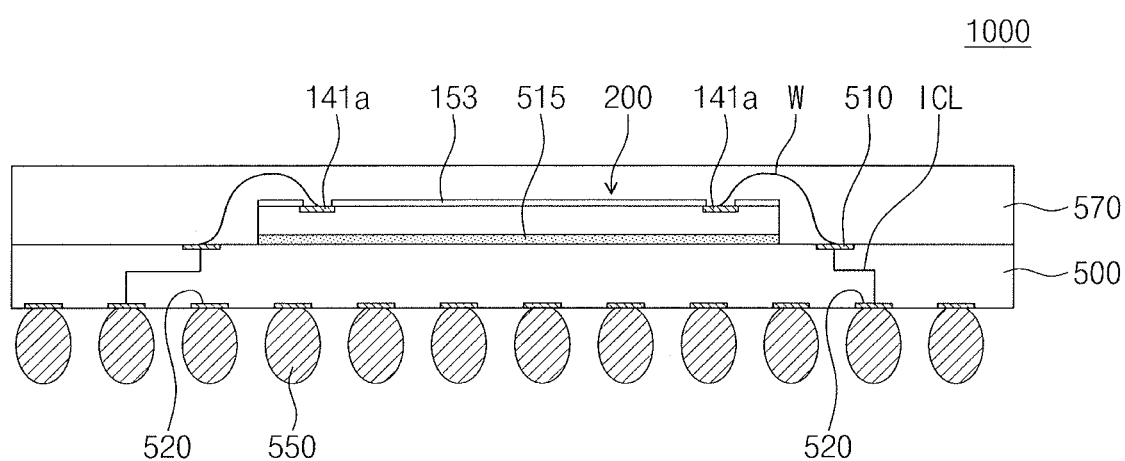
FIG. 15B illustrates a cross-sectional view of a semiconductor package including a semiconductor chip according to some example embodiments.

FIG. 15A illustrates a plan view of a semiconductor chip separated from a semiconductor device according to some example embodiments. FIG. 15B illustrates a cross-sectional view of a semiconductor package including a semiconductor chip according to some example embodiments.

Referring to FIG. 15A, an individually separated semiconductor chip 200 may include the chip region 10 and the edge region 23 around the chip region 10. The residual process monitoring structure 30R may remain on a portion of the edge region 23, and a portion of the third opening OP3 (formed in the lower and upper dielectric layers 110 and 130 of FIG. 5H) may remain on other portion of the edge region 23. The lower dielectric layer 110 may have a step difference on the edge region 23. As discussed above with reference to FIGS. 4B and 5H, the residual process monitoring structure 30R may include portions of the dummy metal structures 120d extending in the first direction D1 or the second direction D2.

Referring to FIG. 15B, a semiconductor package 1000 may include a semiconductor chip 200, a package substrate 500, external connection terminals 550, and a molding layer 570. In an implementation, the package substrate 500 may include the semiconductor chip 200 fabricated by the method discussed above mounted thereon.

The semiconductor chip 200 may include, as discussed above, the redistribution chip pads 141a exposed by the passivation layer 153. The redistribution chip pads 141a may include data pads that communicate data signals, command/address pads that communicate command signals and address signals, and/or power and ground pads to which ground and power voltages are respectively applied.

The package substrate 500 may include, e.g., a printed circuit board, a flexible substrate, or a tape substrate. The package substrate 500 may be one of a flexible printed circuit board, a rigid printed circuit board, and a combination thereof, each of which includes internal connection lines formed therein.

The package substrate 500 may have top and bottom surfaces facing each other, and may include bonding pads 510, internal connection lines ICL, and external connection pads 520. The bonding pads 510 may be arranged on the top surface of the package substrate 500, and the external connection pads 520 may be arranged on the bottom surface of the package substrate 500. The semiconductor chip 200 may be on a central portion of the top surface of the package substrate 500, and an adhesive layer 515 may be between the semiconductor chip 200 and the package substrate 500.

The bonding pads 510 may be connected through wires W to the redistribution chip pads 141a of the semiconductor chip 200. The external connection pads 520 may be connected through the internal connection lines ICL to the bonding pads 510.

The molding layer 570 may cover the semiconductor chip 200 on the top surface of the package substrate 500. The molding layer 570 may include an epoxy molding compound (EMC).

The external connection terminals 550 may be attached to the external connection pads 520 on the bottom surface of the package substrate 500. The semiconductor package 1000 may be connected through the external connection terminals 550 to external electronic devices.

By way of summation and review, high speeds of semiconductor devices have been increasingly considered with the advanced development of the electronic industry. High integration and/or high speed in semiconductor devices have been considered. Some semiconductor chips may include redistribution layers connected to the chip pads so as to change the locations of pads at specified positions of the semiconductor chip.

According to some example embodiments, an etching process may be performed to partially etch lower and upper dielectric layers having different film characteristics on a scribe line region, and when a cutting process is performed on a semiconductor substrate, the semiconductor substrate may be prevented from being incompletely cut, peeling off of thin layers may be suppressed, and cracks may be inhibited from creating and propagating toward a chip region.

One or more embodiments may provide dummy elements in a portion of the scribe line region on which the lower and upper dielectric layers remain, e.g., an edge region surrounding a chip region. For example, dummy elements according to one or more embodiments may include dummy metal structures in the lower dielectric layer and a dummy metal pattern covering the dummy metal structures, and the upper dielectric layer may be on the dummy metal pattern. As another example, dummy elements according to one or more embodiments may include dummy redistribution patterns that penetrate the upper dielectric layer and having upper surfaces lower than an upper surface of the upper dielectric layer. Therefore, creation and propagation of cracks toward the chip region when the cutting process is performed on the semiconductor substrate may be prevented. As a result, semiconductor chips may increase in reliability and yield.

One or more embodiments may provide a semiconductor device including a redistribution chip pad and a process monitoring structure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a semiconductor substrate including a chip region and an edge region around the chip region;
    a lower dielectric layer on the semiconductor substrate;
    an upper dielectric layer on the lower dielectric layer;
    a chip pad on the lower dielectric layer of the chip region;
    a redistribution chip pad that penetrates the upper dielectric layer on the chip region and is connected the chip pad;
    a process monitoring structure on the edge region, the upper dielectric layer covering the process monitoring structure and including an opening spaced apart from the process monitoring structure and exposing a portion of the lower dielectric layer on the edge region;

dummy elements in the edge region and having an upper surface lower than an upper surface of the upper dielectric layer; and a redistribution spacer on an inner wall of the opening of the upper dielectric layer, the redistribution spacer including the same metallic material as that of the redistribution chip pad, wherein the dummy elements include a plurality of dummy redistribution patterns that penetrate the upper dielectric layer in the edge region.

2. The semiconductor device as claimed in claim 1, wherein, when viewed in plan, the plurality of dummy redistribution patterns are around the process monitoring structure.

3. The semiconductor device as claimed in claim 1, wherein the lower dielectric layer includes a dielectric material whose dielectric constant is less than a dielectric constant of the upper dielectric layer.

4. A semiconductor device, comprising:
a semiconductor substrate including a chip region and an edge region around the chip region;
a lower dielectric layer on the semiconductor substrate;
an upper dielectric layer on the lower dielectric layer;
a chip pad on the lower dielectric layer of the chip region;
a redistribution chip pad that penetrates the upper dielectric layer on the chip region and is connected to the chip pad;
a process monitoring pattern on the edge region, the upper dielectric layer covering the process monitoring structure and including an opening spaced apart from the process monitoring structure and exposing a portion of the lower dielectric layer on the edge region;
a redistribution spacer on an inner wall of the opening of the upper dielectric layer, the redistribution spacer including the same metallic material as that of the redistribution chip pad; and
a first dummy redistribution pattern surrounding the process monitoring pattern when viewed in plan.

5. The semiconductor device as claimed in claim 4, wherein a bottom surface the first dummy redistribution pattern is located at a level that is lower than a bottom surface of the process monitoring pattern.

6. The semiconductor device as claimed in claim 4, wherein a bottom surface the first dummy redistribution pattern is in contact with the lower dielectric layer.

7. The semiconductor device as claimed in claim 4, wherein the process monitoring pattern is on the lower dielectric layer and includes a metallic material that is the same as a metallic material of the chip pad.

8. The semiconductor device as claimed in claim 4, wherein the process monitoring pattern is on the upper dielectric layer and includes a metallic material that is the same as the metallic material of the redistribution chip pad.

9. The semiconductor device as claimed in claim 4, wherein the first dummy redistribution pattern includes:
a bottom segment in contact with the lower dielectric layer; and
a plurality of sidewall segments that extend from the bottom segment.

10. A semiconductor device, comprising:
a semiconductor substrate including a chip region and an edge region around the chip region;
a lower dielectric layer on the semiconductor substrate;
an upper dielectric layer on the lower dielectric layer;
a redistribution chip pad that penetrates the upper dielectric layer on the chip region and is connected to a chip pad;
a process monitoring pattern on the edge region, the upper dielectric layer covering the process monitoring structure and including an opening spaced apart from the process monitoring structure and exposing a portion of the lower dielectric layer on the edge region;
a plurality of dummy redistribution patterns that penetrate the upper dielectric layer on the edge region; and
a redistribution spacer on an inner wall of the opening of the upper dielectric layer, the redistribution spacer including the same metallic material as that of the redistribution chip pad,
wherein, when viewed in plan, the plurality of dummy redistribution patterns are around the process monitoring pattern.

11. The semiconductor device as claimed in claim 10, wherein the plurality of dummy redistribution patterns includes:
a plurality of first dummy redistribution patterns each having a first width, the plurality of first dummy redistribution patterns surrounding the process monitoring pattern when viewed in plan; and
a plurality of second dummy redistribution patterns between the plurality of first dummy redistribution patterns and the process monitoring pattern, the plurality of second dummy redistribution patterns each having a second width that is less than the first width.

12. The semiconductor device as claimed in claim 11, wherein bottom surfaces of the plurality of first dummy redistribution patterns are located at a level that is lower than that of bottom surfaces of the plurality of second dummy redistribution patterns.

13. The semiconductor device as claimed in claim 10, wherein each of the plurality of dummy redistribution patterns includes:
a bottom segment in contact with the lower dielectric layer; and
a plurality of sidewall segments that extend from the bottom segment.

14. The semiconductor device as claimed in claim 13, further comprising a passivation layer on the upper dielectric layer of the chip region and exposing a portion of the redistribution chip pad,
wherein the passivation layer extends toward the edge region, the passivation layer filling a gap defined by the bottom segment and the sidewall segments of each of the plurality of dummy redistribution patterns.

15. The semiconductor device as claimed in claim 10, wherein the process monitoring pattern is on the upper dielectric layer and includes a metallic material that is the same as the metallic material of the redistribution chip pad.

16. The semiconductor device as claimed in claim 10, wherein the process monitoring pattern is on the lower dielectric layer and includes a metallic material that is the same as a metallic material of the chip pad.

17. The semiconductor device as claimed in claim 10, wherein the lower dielectric layer includes a dielectric material whose dielectric constant is less than a dielectric constant of the upper dielectric layer.

18. The semiconductor device as claimed in claim 10, further comprising:
a semiconductor integrated circuit on the semiconductor substrate of the chip region; and
a plurality of metal lines and a plurality of metal vias in the lower dielectric layers of the chip region, the metal lines and the metal vias connecting the semiconductor integrated circuit to the chip pad.

* * * * *